(12) United States Patent
Wang et al.

(10) Patent No.: US 10,943,955 B2
(45) Date of Patent: Mar. 9, 2021

(54) PIXEL ARRANGEMENT STRUCTURE, DISPLAY SUBSTRATE, DISPLAY DEVICE AND MASK PLATE GROUP

(71) Applicant: BOE TECHNOLOGY GROUP CO., LTD., Beijing (CN)

(72) Inventors: Hongli Wang, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/492,930

(22) PCT Filed: Dec. 28, 2018

(86) PCT No.: PCT/CN2018/124890
§ 371 (c)(1),
(2) Date: Sep. 10, 2019

(87) PCT Pub. No.: WO2019/153950
PCT Pub. Date: Aug. 15, 2019

(65) Prior Publication Data
US 2020/0013833 A1 Jan. 9, 2020

(30) Foreign Application Priority Data
Feb. 9, 2018 (CN) .......................... 201810137012.7

(51) Int. Cl.
*H01L 27/32* (2006.01)
(52) U.S. Cl.
CPC ........ *H01L 27/3218* (2013.01); *H01L 27/322* (2013.01); *H01L 27/3213* (2013.01); *H01L 27/3246* (2013.01)

(58) Field of Classification Search
None
See application file for complete search history.

(56) References Cited

U.S. PATENT DOCUMENTS

| 4,491,863 A | 1/1985 | Kurahashi |
| 4,652,912 A | 3/1987 | Masubuchi |

(Continued)

FOREIGN PATENT DOCUMENTS

| CN | 101192382 A | 6/2008 |
| CN | 102201430 A | 9/2011 |

(Continued)

OTHER PUBLICATIONS

Office action issued in Indian Application No. 201717038562, dated Oct. 15, 2019, 7 pages.

(Continued)

*Primary Examiner* — Parul H Gupta
(74) *Attorney, Agent, or Firm* — Dave Law Group LLC; Raj S. Dave

(57) ABSTRACT

A pixel arrangement structure, a display substrate, a display device, and a mask plate set are provided. In the pixel arrangement structure, a first virtual rectangle includes one first color sub-pixel block, one second color sub-pixel block, and one third color sub-pixel block, the first virtual rectangle includes a first edge and a second edge; a distance between the second color sub-pixel block and the first edge and a distance between the third color sub-pixel block and the first edge are both smaller than a distance between the first color sub-pixel block and the first edge; and a center of the first color sub-pixel block is located on the perpendicular bisector of the first edge and a distance between the center of the first color sub-pixel block and the first edge is approximately ½ to ¾ of a length of the second edge.

19 Claims, 7 Drawing Sheets

(56) References Cited

U.S. PATENT DOCUMENTS

| | | | |
|---|---|---|---|
| 5,113,274 | A | 5/1992 | Takahashi et al. |
| 5,341,153 | A | 8/1994 | Benzschawel et al. |
| 6,768,482 | B2 | 7/2004 | Asano et al. |
| 6,950,115 | B2 | 9/2005 | Brown Elliot |
| 7,663,299 | B2 | 2/2010 | Chao et al. |
| 7,733,359 | B1 | 6/2010 | Hagge et al. |
| 8,159,508 | B2 | 4/2012 | Lee |
| 8,363,072 | B2 | 1/2013 | Hong et al. |
| 8,446,435 | B2 | 5/2013 | Tomizawa et al. |
| 8,754,913 | B2 | 6/2014 | Hwang et al. |
| 8,994,015 | B2 | 3/2015 | Pyon et al. |
| 9,343,511 | B1 | 5/2016 | Feng |
| 9,424,771 | B2 | 8/2016 | Gong |
| 9,704,926 | B2 | 7/2017 | Kim |
| 9,818,803 | B2 | 11/2017 | Lee |
| 9,871,085 | B2 | 1/2018 | Cho et al. |
| 9,905,604 | B2 | 2/2018 | Murata |
| 9,946,123 | B2 | 4/2018 | Huangfu et al. |
| 2005/0018110 | A1 | 1/2005 | Liu |
| 2007/0205423 | A1 | 9/2007 | Yamazaki et al. |
| 2007/0290973 | A1 | 12/2007 | Wei |
| 2008/0001525 | A1 | 1/2008 | Chao et al. |
| 2009/0121983 | A1 | 5/2009 | Sung et al. |
| 2009/0302331 | A1 | 12/2009 | Smith et al. |
| 2011/0128262 | A1 | 6/2011 | Chaji et al. |
| 2011/0234550 | A1 | 9/2011 | Hong et al. |
| 2011/0260951 | A1 | 10/2011 | Hwang et al. |
| 2011/0291549 | A1 | 12/2011 | Kim et al. |
| 2012/0039034 | A1* | 2/2012 | Jepsen ............ G02F 1/133555 361/679.21 |
| 2012/0092238 | A1 | 4/2012 | Hwang et al. |
| 2013/0234917 | A1 | 9/2013 | Lee |
| 2014/0003045 | A1 | 1/2014 | Lee et al. |
| 2014/0029262 | A1 | 1/2014 | Maxik et al. |
| 2014/0198479 | A1 | 7/2014 | Chao et al. |
| 2014/0226323 | A1 | 8/2014 | Huang et al. |
| 2014/0252321 | A1 | 9/2014 | Pyon et al. |
| 2015/0015465 | A1 | 1/2015 | Gong |
| 2015/0021637 | A1 | 1/2015 | Ahn et al. |
| 2015/0102320 | A1 | 4/2015 | Jung |
| 2015/0162394 | A1 | 6/2015 | Tokuda et al. |
| 2016/0049438 | A1 | 2/2016 | Murata |
| 2016/0126296 | A1* | 5/2016 | Feng ................ H01L 27/3218 257/40 |
| 2016/0126298 | A1 | 5/2016 | Chen |
| 2016/0155781 | A1 | 6/2016 | Chaji |
| 2016/0171918 | A1 | 6/2016 | Kim et al. |
| 2016/0190523 | A1 | 6/2016 | Kim et al. |
| 2016/0196776 | A1 | 7/2016 | Yang et al. |
| 2016/0253943 | A1 | 9/2016 | Wang |
| 2016/0293678 | A1 | 10/2016 | Wang |
| 2016/0351119 | A1 | 12/2016 | Ono |
| 2016/0357076 | A1 | 12/2016 | Huangfu et al. |
| 2016/0358985 | A1 | 12/2016 | Bai et al. |
| 2017/0193880 | A1 | 7/2017 | Lee et al. |
| 2017/0294491 | A1 | 10/2017 | Jo et al. |
| 2017/0317150 | A1 | 11/2017 | Chung et al. |
| 2018/0088260 | A1 | 3/2018 | Jin et al. |
| 2018/0308907 | A1 | 10/2018 | Jin et al. |
| 2019/0115399 | A1 | 4/2019 | Jo et al. |
| 2019/0206341 | A1 | 7/2019 | Liao et al. |
| 2019/0237518 | A1 | 8/2019 | Sun et al. |
| 2020/0035172 | A1 | 1/2020 | Chen |

FOREIGN PATENT DOCUMENTS

| | | |
|---|---|---|
| CN | 104051493 A | 9/2014 |
| CN | 104269411 A | 1/2015 |
| CN | 104282727 A | 1/2015 |
| CN | 104332486 A | 2/2015 |
| CN | 104362170 A | 2/2015 |
| CN | 104597655 A | 5/2015 |
| CN | 104701341 A | 6/2015 |
| CN | 104882464 A | 9/2015 |
| CN | 205231065 U | 5/2016 |
| CN | 205355055 U | 6/2016 |
| CN | 205608350 U | 9/2016 |
| CN | 205845956 U | 12/2016 |
| CN | 106293244 A | 1/2017 |
| CN | 106601167 A | 4/2017 |
| CN | 106782307 A | 5/2017 |
| CN | 106935618 A | 7/2017 |
| CN | 106935630 A | 7/2017 |
| CN | 107248378 A | 10/2017 |
| CN | 107256695 A | 10/2017 |
| CN | 107275359 A | 10/2017 |
| CN | 107393468 A | 11/2017 |
| CN | 107644888 A | 1/2018 |
| CN | 107665684 A | 2/2018 |
| CN | 107817632 A | 3/2018 |
| CN | 107910348 A | 4/2018 |
| CN | 105280139 B | 5/2018 |
| CN | 207781607 U | 8/2018 |
| CN | 207781608 U | 8/2018 |
| CN | 207883217 U | 9/2018 |
| CN | 109491158 A | 3/2019 |
| CN | 109559679 A | 4/2019 |
| EP | 2680310 A1 | 1/2014 |
| JP | 2002-221917 A | 8/2002 |
| JP | 2008-015521 A | 1/2008 |
| KR | 10-2009-0049515 A | 5/2009 |
| KR | 1020110108050 A | 10/2011 |
| KR | 101347995 B1 | 1/2014 |
| KR | 1020150006668 A | 1/2015 |
| KR | 20160051511 A | 5/2016 |
| WO | 2017/140038 A1 | 8/2017 |

OTHER PUBLICATIONS

Office action issued in Korean Application No. 10-2017-7022698, dated May 29, 2019, 13 pages.

Candice Hellen Brown Elliot, "Reducing pixel count without reducing image quality", Information display Dec. 1999, 4 pages.

Lu Fang, Oscar C. Au and Ngai-Man Cheung, "Subpixel Rendering: From Font Rendering to Image Subsampling", IEEE Signal Processing Magazine, 1053-5888, Apr. 5, 2013, 7 pages.

Dean S. Messing and Scott Daly, "Improved Display Resolution of Subsampled Colour Images Using Subpixel Addressing", IEEE ICIP 2002, 0-7803-7622-6, 2002, 4 pages.

Huang Cheng-qiang et al., "RGB to RGBG conversion algorithm based on weighting factors and related FPGA realization", China Journal of Liquid Crystals and Displays, vol. 32 No. 7, Jul. 2017, 8 pages.

Non-Final Office action issued in U.S. Appl. No. 15/536,347, dated Aug. 28, 2018, 18 pages.

Non-Final Office action issued in U.S. Appl. No. 15/578,481, dated Feb. 1, 2019, 24 pages.

Final Office action issued in U.S. Appl. No. 15/578,481, dated Jul. 11, 2019, 17 pages.

Search report issued in European Application No. 17768339.8, dated Jun. 12, 2019, 8 pages.

Office action issued in Korean Application No. 1020197024785, dated Jul. 30, 2020, 17 pages.

Office action issued in Chinese Application No. 201810135947.1, dated Mar. 3, 2020, 17 pages.

Notice of Allowance issued for U.S. Appl. No. 16/234,777, dated Sep. 1, 2020, 22 pages.

Non-Final office action issued for U.S. Appl. No. 16/600,316, dated Oct. 6, 2020, 45 pages.

Non-Final office action issued for U.S. Appl. No. 16/621,918, dated Sep. 29, 2020, 34 pages.

Notice of Reasons for Refusal dated Oct. 19, 2020 for Japanese Patent Application No. 2017-544608.

Notice of Reasons for Refusal dated Dec. 25, 2020 for Korean Patent Application No. 10-2019-7027773.

* cited by examiner

PIXEL ARRANGEMENT STRUCTURE, DISPLAY SUBSTRATE, DISPLAY DEVICE AND MASK PLATE GROUP

CROSS-REFERENCE

The present application is the U.S. national stage of International Patent Application No. PCT/CN2018/124890, Dec. 28, 2018, which claims the benefit of priority to Chinese patent application No. 201810137012.7, filed on Feb. 9, 2018, the entire disclosures of which are incorporated herein by reference as part of the present application.

TECHNICAL FIELD

Embodiments of the present disclosure relate to a pixel arrangement structure, a display substrate, a display device and a mask plate set.

BACKGROUND

With continuous development of the display technology, people have higher and higher requirements for resolution of a display device. Due to advantages such as high display quality, high-resolution display devices are applied more and more widely. Usually, the resolution of the display device can be improved by reducing a pixel size and a pixel pitch. However, reduction in the pixel size and the pixel pitch is also increasingly demanding for precision of manufacturing process, which may result in increased difficulties and costs in a manufacturing process of the display device.

On the other hand, a conventional mode in which one pixel is simply defined by a red sub-pixel, a green sub-pixel and a blue sub-pixel may be changed by using a Sup-Pixel Rendering (SPR) technology, because resolution of human eyes with respect to different colors of sub-pixels is varied; and by sharing between different pixels a sub-pixel of a color which the resolution of a certain position is not sensitive to, an equivalent performance capability of pixel resolution may be simulated by a relatively small amount of sub-pixels, so as to simplify the manufacturing process and reduce the fabrication costs.

SUMMARY

At least one embodiment of the present disclosure provides a pixel arrangement structure, which includes: a plurality of first color sub-pixel blocks, a plurality of second color sub-pixel blocks and a plurality of third color sub-pixel blocks distributed in a plurality of minimum repeating regions, each of the plurality of minimum repeating regions has a shape of rectangle and includes a first virtual rectangle; the first virtual rectangle includes one first color sub-pixel block of the plurality of first color sub-pixel blocks, one second color sub-pixel block of the plurality of second color sub-pixel blocks and one third color sub-pixel block of the plurality of third color sub-pixel blocks, the first virtual rectangle includes a first edge extending in a first direction and a second edge extending in a second direction; and the second color sub-pixel block and the third color sub-pixel block are distributed on two sides of a perpendicular bisector of the first edge; a distance between the second color sub-pixel block and the first edge and a distance between the third color sub-pixel block and the first edge are both smaller than a distance between the first color sub-pixel block and the first edge; and a center of the first color sub-pixel block is located on the perpendicular bisector of the first edge and a distance between the center of the first color sub-pixel block and the first edge is approximately ½ to ¾ of a length of the second edge.

For example, in the pixel arrangement structure provided by an embodiment of the present disclosure, each of the plurality of minimum repeating regions further includes a second virtual rectangle, a third virtual rectangle and a fourth virtual rectangle; and the first virtual rectangle, the second virtual rectangle, the third virtual rectangle and the fourth virtual rectangle form a 2*2 matrix in an edge-sharing manner to constitute one of the plurality of minimum repeating regions, the second virtual rectangle shares the first edge with the first virtual rectangle, and the second virtual rectangle is mirror-symmetrical to the first virtual rectangle with respect to the first edge, the first virtual rectangle coincides with the third virtual rectangle by shifting a distance of a length of a diagonal line of the first virtual rectangle along the diagonal line; the third virtual rectangle includes a third edge extending in the first direction; the fourth virtual rectangle shares the third edge with the third virtual rectangle, the fourth virtual rectangle is mirror-symmetrical to the third virtual rectangle with respect to the third edge; the third edge and the first edge are located in a same straight line.

For example, in the pixel arrangement structure provided by an embodiment of the present disclosure, the second color sub-pixel block and the third color sub-pixel block are respectively close to two ends of the first edge, and edges of the second color sub-pixel block and the third color sub-pixel block that are away from a center of the first virtual rectangle are located on the first edge.

For example, in the pixel arrangement structure provided by an embodiment of the present disclosure, the first color sub-pixel block is a green sub-pixel, the second color sub-pixel block is a red sub-pixel, and the third color sub-pixel block is a blue sub-pixel.

For example, in the pixel arrangement structure provided by an embodiment of the present disclosure, a shape of the first color sub-pixel block is a right-base-angle symmetrical pentagon; the right-base-angle symmetrical pentagon is symmetrical with respect to the perpendicular bisector of the first edge; and a base of the right-base-angle symmetrical pentagon is further away from the first edge than a vertex of the right-base-angle symmetrical pentagon in a direction perpendicular to the first edge.

For example, in the pixel arrangement structure provided by an embodiment of the present disclosure, shapes of the second color sub-pixel block and the third color sub-pixel block are both right-base-angle symmetrical pentagons; bases of the right-base-angle symmetrical pentagons are parallel to the first edge or are located on the first edge, and are closer to the first edge than the vertexes of the right-base-angle symmetrical pentagons in the direction perpendicular to the first edge.

For example, in the pixel arrangement structure provided by an embodiment of the present disclosure, shapes of the second color sub-pixel block and the third color sub-pixel block are both right-base-angle pentagons; bases of the right-base-angle pentagons are parallel to the first edge or are located on the first edge, and are closer to the first edge than vertexes of the right-base-angle pentagons in a direction perpendicular to the first edge; each of the right-base-angle pentagons includes a first oblique edge and a second oblique edge passing through the vertex of the each of the right-base-angle pentagons; the first oblique edge is opposite to the first color sub-pixel block located within the same virtual rectangle; and a length of the first oblique edge is larger than a length of the second oblique edge.

For example, in the pixel arrangement structure provided by an embodiment of the present disclosure, a shape of the first color sub-pixel block is a right-base-angle symmetrical pentagon; the right-base-angle symmetrical pentagon is symmetrical with respect to the perpendicular bisector of the first edge; a base of the right-base-angle symmetrical pentagon is parallel to the first edge or is located on the first edge, and is further away from the first edge than a vertex of the right-base-angle symmetrical pentagon in the direction perpendicular to the first edge; the right-base-angle symmetrical pentagon includes a third oblique edge and a fourth oblique edge passing through the vertex of the right-base-angle symmetrical pentagon; the third oblique edge and the fourth oblique edge are equal in length; the third oblique edge of the first color sub-pixel block and the first oblique edge of the second color sub-pixel block located within the same virtual rectangle are parallel to each other and have a spacing of a first distance; and the fourth oblique edge of the first color sub-pixel block and the first oblique edge of the third color sub-pixel block located within the same virtual rectangle are parallel to each other and have a spacing of a second distance.

For example, in the pixel arrangement structure provided by an embodiment of the present disclosure, within the first virtual rectangle and the second virtual rectangle, the third color sub-pixel block is closer to a center of the minimum repeating region than the second color sub-pixel block; within the third virtual rectangle and the fourth virtual rectangle, the second color sub-pixel block is closer to the center of the minimum repeating region than the third color sub-pixel block; the third color sub-pixel block in the first virtual rectangle is adjacent to the second color sub-pixel block in the fourth virtual rectangle; the third color sub-pixel block in the second virtual rectangle is adjacent to the second color sub-pixel block in the third virtual rectangle; the second oblique edge of the third color sub-pixel block in the first virtual rectangle and the second oblique edge of the second color sub-pixel block in the fourth virtual rectangle are parallel to each other and have a spacing of a third distance; and the second oblique edge of the third color sub-pixel block in the second virtual rectangle and the second oblique edge of the second color sub-pixel block in the third virtual rectangle are parallel to each other and have a spacing of a fourth distance.

For example, in the pixel arrangement structure provided by an embodiment of the present disclosure, the first distance, the second distance, the third distance and the fourth distance are substantially equal to one another.

For example, in the pixel arrangement structure provided by an embodiment of the present disclosure, shapes of the second color sub-pixel block and the third color sub-pixel block are both right-angled trapezoids; bases of the right-angled trapezoids are perpendicular to the first edge; and a distance between a right-angle edge of the right-angled trapezoid and the first edge is less than a distance between an oblique edge of the right-angled trapezoid and the first edge.

For example, in the pixel arrangement structure provided by an embodiment of the present disclosure, a shape of the first color sub-pixel block is a right-base-angle symmetrical pentagon; the right-base-angle symmetrical pentagon is symmetrical with respect to the perpendicular bisector of the first edge; a base of the right-base-angle symmetrical pentagon is parallel to the first edge or is located on the first edge, and is further away from the first edge than a vertex of the right-base-angle symmetrical pentagon in a direction perpendicular to the first edge; the right-base-angle symmetrical pentagon includes a third oblique edge and a fourth oblique edge passing through the vertex of the right-base-angle symmetrical pentagon; the third oblique edge and the fourth oblique edge are equal in length; the third oblique edge of the first color sub-pixel block and the oblique edge of the second color sub-pixel block located within a same virtual rectangle are parallel to each other and have a spacing of a fifth distance; and the fourth oblique edge of the first color sub-pixel block and the oblique edge of the third color sub-pixel block located within the same virtual rectangle are parallel to each other and have a spacing of a sixth distance.

For example, in the pixel arrangement structure provided by an embodiment of the present disclosure, within the first virtual rectangle and the second virtual rectangle, the third color sub-pixel block is closer to a center of the minimum repeating region than the second color sub-pixel block; within the third virtual rectangle and the fourth virtual rectangle, the second color sub-pixel block is closer to the center of the minimum repeating region than the third color sub-pixel block; the third color sub-pixel block in the first virtual rectangle is adjacent to the second color sub-pixel block in the fourth virtual rectangle; the third color sub-pixel block in the second virtual rectangle is adjacent to the second color sub-pixel block in the third virtual rectangle; an acute-angle portion of the third color sub-pixel block in the first virtual rectangle and an acute-angle portion of the second color sub-pixel block in the fourth virtual rectangle have a spacing of a seventh distance, and an acute-angle portion of the third color sub-pixel block in the second virtual rectangle and an acute-angle portion of the second color sub-pixel block in the third virtual rectangle have a spacing of an eighth distance.

For example, in the pixel arrangement structure provided by an embodiment of the present disclosure, the fifth distance, the sixth distance, the seventh distance and the eighth distance are substantially equal to one another.

For example, in the pixel arrangement structure provided by an embodiment of the present disclosure, within the same one of the plurality of minimum repeating region, a second color sub-pixel block of the first virtual rectangle and a second color sub-pixel block of the second virtual rectangle are combined into a same sub-pixel; within two adjacent ones of the plurality of minimum repeating regions in the second direction, the two adjacent ones of the plurality of minimum repeating regions include a first minimum repeating region and a second minimum repeating region sequentially arranged in the second direction; and the second color sub-pixel block of the fourth virtual rectangle of the first minimum repeating region and the second color sub-pixel block of the third virtual rectangle of the second minimum repeating region are combined into a same sub-pixel.

For example, in the pixel arrangement structure provided by an embodiment of the present disclosure, within the same one of the plurality of minimum repeating regions, the third color sub-pixel block of the first virtual rectangle and the third color sub-pixel block of the second virtual rectangle are combined into a same sub-pixel; within two adjacent ones of the plurality of minimum repeating regions in the second direction, the two adjacent ones of the plurality of minimum repeating regions include a first minimum repeating region and a second minimum repeating region sequentially arranged in the second direction; and the third color sub-pixel block of the fourth virtual rectangle of the first minimum repeating region and the third color sub-pixel block of the third virtual rectangle of the second minimum repeating region are combined into a same sub-pixel.

For example, in the pixel arrangement structure provided by an embodiment of the present disclosure, within the same one of the plurality of minimum repeating regions, the first color sub-pixel block of the third virtual rectangle and the first color sub-pixel block of the fourth virtual rectangle share a same single color pattern region in a sub-pixel patterning process; within two adjacent ones of the plurality of minimum repeating regions in the second direction, the two adjacent ones of the plurality of minimum repeating regions include a first minimum repeating region and a second minimum repeating region sequentially arranged in the second direction; and the first color sub-pixel block of the first virtual rectangle of the first minimum repeating region and the first color sub-pixel block of the second virtual rectangle of the second minimum repeating region share a same single color pattern region in a sub-pixel patterning process.

For example, in the pixel arrangement structure provided by an embodiment of the present disclosure, first color sub-pixel blocks in the third virtual rectangle and the fourth virtual rectangle are replaced with fourth color sub-pixel blocks.

For example, in the pixel arrangement structure provided by an embodiment of the present disclosure, the first color sub-pixel block includes a green sub-pixel, and the fourth color sub-pixel block includes a yellow sub-pixel.

For example, in the pixel arrangement structure provided by an embodiment of the present disclosure, first color sub-pixel blocks in the third virtual rectangle and the fourth virtual rectangle are replaced with fourth color sub-pixel blocks; and first color sub-pixel blocks in the first virtual rectangle and the third virtual rectangle are replaced with fifth color sub-pixel blocks.

For example, in the pixel arrangement structure provided by an embodiment of the present disclosure, the first color sub-pixel block includes a green sub-pixel, and the fifth color sub-pixel block includes a white sub-pixel.

At least one embodiment of the present disclosure provides a display substrate, which includes: a base substrate; and a plurality of pixels arranged on the base substrate, the plurality of pixels adopt any one of the abovementioned pixel arrangement structure.

For example, in the display substrate provided by an embodiment of the present disclosure, each of the plurality of minimum repeating regions further includes a second virtual rectangle, a third virtual rectangle and a fourth virtual rectangle; the first virtual rectangle, the second virtual rectangle, the third virtual rectangle and the fourth virtual rectangle form a 2*2 matrix in an edge-sharing manner to constitute one of the plurality of minimum repeating regions; the second virtual rectangle shares the first edge with the first virtual rectangle, and the second virtual rectangle is mirror-symmetrical to the first virtual rectangle with respect to the first edge; the first virtual rectangle coincides with the third virtual rectangle by shifting a distance of a length of a diagonal line of the first virtual rectangle along the diagonal line; the third virtual rectangle includes a third edge extending in the first direction; the fourth virtual rectangle shares the third edge with the third virtual rectangle, the fourth virtual rectangle is mirror-symmetrical to the third virtual rectangle with respect to the third edge; the third edge and the first edge are located in a same straight line; the first color sub-pixel block includes a first color pixel electrode and a first color light-emitting layer provided on the first color pixel electrode, the second color sub-pixel block includes a second color pixel electrode and a second color light-emitting layer provided on the second color pixel electrode, and the third color sub-pixel block includes a third color pixel electrode and a third color light-emitting layer provided on the third color pixel electrode; the first color pixel electrode is configured to drive the first color light-emitting layer to emit light; the second color pixel electrode is configured to drive the second color light-emitting layer to emit light; and the third color pixel electrode is configured to drive the third color light-emitting layer to emit light.

For example, in the display substrate provided by an embodiment of the present disclosure, within the same one of the plurality of minimum repeating regions, the first color light-emitting layer of the first color sub-pixel block of the third virtual rectangle and the first color light-emitting layer of the first color sub-pixel block of the fourth virtual rectangle are formed by sharing a same single color pattern region; within two adjacent ones of the plurality of minimum repeating regions in the second direction, the two adjacent ones of the plurality of minimum repeating regions include a first minimum repeating region and a second minimum repeating region sequentially arranged in the second direction; and the first color light-emitting layer of the first color sub-pixel block of the first virtual rectangle of the first minimum repeating region and the first color light-emitting layer of the first color sub-pixel block of the second virtual rectangle of the second minimum repeating region are formed by sharing a same single color pattern region.

For example, in the display substrate provided by an embodiment of the present disclosure, within the same one of the plurality of minimum repeating regions, an area of the first color light-emitting layer of the first color sub-pixel block of the third virtual rectangle and the first color light-emitting layer of the first color sub-pixel block of the fourth virtual rectangle formed by sharing the same single color pattern region is larger than a sum of an area of the first color pixel electrode of the first color sub-pixel block of the third virtual rectangle and an area of the first color pixel electrode of the first color sub-pixel block of the fourth virtual rectangle; within the two adjacent ones of the plurality of minimum repeating regions in the second direction, the two adjacent ones of the plurality of minimum repeating regions include the first minimum repeating region and the second minimum repeating region sequentially arranged in the second direction; an area of the first color light-emitting layer of the first color sub-pixel block of the first virtual rectangle of the first minimum repeating region and the first color light-emitting layer of the first color sub-pixel block of the second virtual rectangle of the second minimum repeating region formed by sharing the same single color pattern region is larger than a sum of an area of the first color pixel electrode of the first color sub-pixel block of the first virtual rectangle of the first minimum repeating region and an area of the first color pixel electrode of the first color sub-pixel block of the second virtual rectangle of the second minimum repeating region.

For example, in the display substrate provided by an embodiment of the present disclosure, within the same one of the plurality of minimum repeating regions, the second color pixel electrode of the second color sub-pixel block of the first virtual rectangle and the second color pixel electrode of the second color sub-pixel block of the second virtual rectangle are combined into a same pixel electrode; within two adjacent ones of the plurality of minimum repeating regions, the two adjacent ones of the plurality of minimum repeating regions include a first minimum repeating region and a second minimum repeating region sequentially arranged in the second direction; and the second color pixel electrode of the second color sub-pixel block of the fourth virtual rectangle of the first minimum repeating region and the second color pixel electrode of the second color sub-pixel block of the third virtual rectangle of the second minimum repeating region are combined into a same pixel electrode.

For example, in the display substrate provided by an embodiment of the present disclosure, within the same one of the plurality of minimum repeating regions, the third color pixel electrode of the third color sub-pixel block of the first virtual rectangle and the third color pixel electrode of the third color sub-pixel block of the second virtual rectangle are combined into a same pixel electrode; within two adjacent ones of the plurality of minimum repeating region in the second direction, the two adjacent ones of the plurality of minimum repeating region include a first minimum repeating region and a second minimum repeating region sequentially arranged in the second direction; and the third color pixel electrode of the third color sub-pixel block of the fourth virtual rectangle of the first minimum repeating region and the third color pixel electrode of the third color sub-pixel block of the third virtual rectangle of the second minimum repeating region are combined into a same pixel electrode.

For example, in the display substrate provided by an embodiment of the present disclosure, the first color sub-pixel block includes a first color filter, the second color sub-pixel block includes a second color filter, and the third color sub-pixel block includes a third color filter.

At least one embodiment of the present disclosure provides a display device, including any one of the abovementioned display substrate.

At least one embodiment of the present disclosure provides a mask plate set, configured to manufacture the abovementioned display substrate, including: a first mask plate, including a first opening, and configured to form the first color sub-pixel block; a second mask plate, including a second opening, and configured to form the second color sub-pixel block; and a third mask plate, including a third opening, and configured to form the third color sub-pixel block; a first color light-emitting layer of the first color sub-pixel block of the third virtual rectangle and a first color light-emitting layer of the first color sub-pixel block of the fourth virtual rectangle are configured to be formed through the same first opening.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the invention apparent, technical solutions according to the embodiments of the present disclosure will be described clearly and completely as below in conjunction with the accompanying drawings of embodiments of the present disclosure. It is to be understood that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly.

In the study, the inventor(s) of the present application notices that: in order to manufacture a high-resolution display device, it is necessary to reduce a pixel size and a pixel pitch; however, reduction in the pixel size and the pixel pitch is also increasingly demanding for precision of manufacturing process, which may result in increased difficulties and costs in a manufacturing process of the display device. For example, upon a high-resolution active matrix organic light emitting diode (AMOLED) display device being manufactured, due to a limitation in process precision of a fine metal mask (FMM) technology, it is difficult and expensive to manufacture the active matrix organic light emitting diode (AMOLED) display device having high resolution (for example, Pixels Per Inch (PPI) greater than 300).

Figure 1:
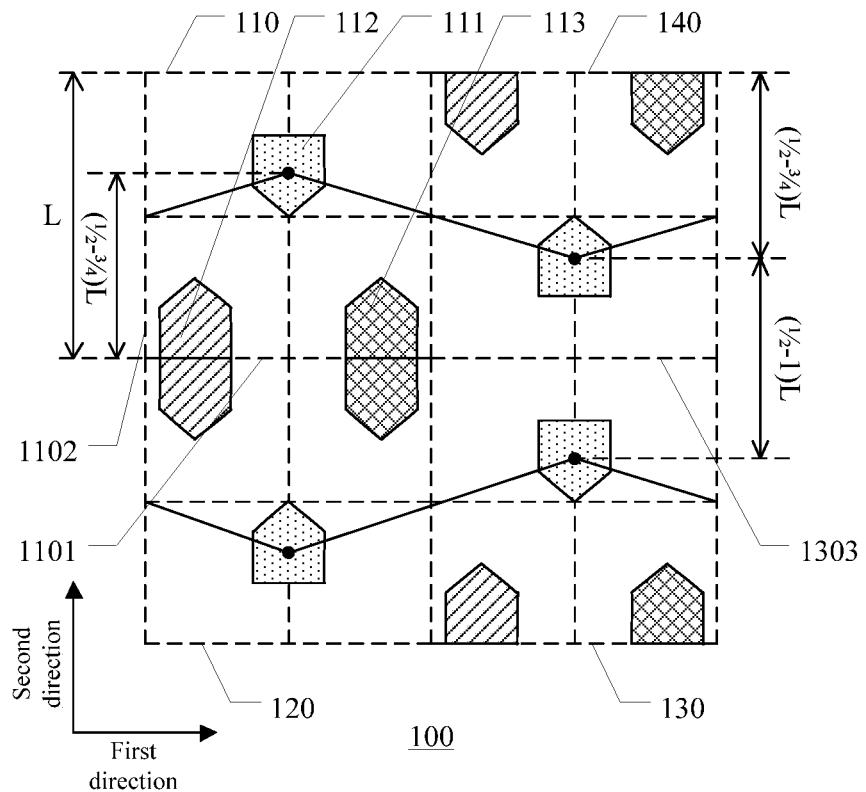
FIG. 1 is a schematic diagram of a pixel arrangement structure provided by an embodiment of the present disclosure.

At least one embodiment of the present disclosure provides a pixel arrangement structure. FIG. 1 is a schematic diagram of a pixel arrangement structure provided by an embodiment of the present disclosure. The pixel arrangement structure comprises a plurality of first color sub-pixel blocks 111, a plurality of second color sub-pixel blocks 112 and a plurality of third color sub-pixel blocks 113 distributed in a plurality of minimum repeating regions 100. FIG. 1 shows one minimum repeating region 100; as illustrated by FIG. 1, each of the plurality of minimum repeating regions 100 includes a first virtual rectangle 110; and the first virtual rectangle 110 includes one first color sub-pixel block 111, one second color sub-pixel block 112 and one third color sub-pixel block 113. The first virtual rectangle 110 includes a first edge 1101 extending in a first direction and a second edge 1102 extending in a second direction; the second color sub-pixel block 112 and the third color sub-pixel block 113 are distributed on two sides of a perpendicular bisector of the first edge 1101; a distance between the second color sub-pixel block 112 and the first edge 1101 and a distance between the third color sub-pixel block 113 and the first edge 1101 are both smaller than a distance between the first color sub-pixel block 111 and the first edge 1101; and a center of the first color sub-pixel block 111 is located on the perpendicular bisector of the first edge 1101 and a distance between the center of the first color sub-pixel block 111 and the first edge 1101 is approximately ½ to ¾ of a length of the second edge 1102. For example, as illustrated by FIG. 1, the length of the second edge 1102 is L, and the distance between the center of the first color sub-pixel block 111 and the first edge 1101 is (½ to ¾)L. It should be noted that, the above-described first virtual rectangle is intended to better describe a position of the first color sub-pixel block, and is not an actual structure. In addition, a range of a virtual rectangle of the above-described first virtual rectangle may be larger than a light-emitting region of the first color sub-pixel block, the second color sub-pixel block and the third color sub-pixel block in the first virtual rectangle. The above-described "center" refers to a geometric center of a shape of a sub-pixel block (for example, the first color sub-pixel block, the second color sub-pixel block or the third color sub-pixel block); and the above-described "a distance between the second color sub-pixel block and the first edge and a distance between the third color sub-pixel block and the first edge" refer to a distance between the center of the second color sub-pixel block and the first edge and a distance between the center of the third color sub-pixel block and the first edge.

In the pixel arrangement structure provided by this embodiment, because the second color sub-pixel block and the third color sub-pixel block are distributed on two sides of the perpendicular bisector of the first edge, and the center of the first color sub-pixel block is located on the perpendicular bisector of the first edge and the distance between the center of the first color sub-pixel block and the first edge is ½ to ¾ of the length of the second edge, a distance between centers of adjacent two first color sub-pixel blocks is larger than ½ of the length of the second edge, which, thus, can avoid a case where the adjacent two first color sub-pixel blocks are difficult to distinguish and are visually combined into one by human eyes due to a closer distance between the adjacent first color sub-pixel blocks, so that granular sensation generated thereby can be avoided. Thus, the pixel arrangement structure can improve uniformity of distribution of first color sub-pixel blocks, so as to improve visual resolution and further improve display quality.

For example, in some examples, the above-described minimum repeating region can be translated and arranged repeatedly to form a complete pixel arrangement structure. It should be noted that any sub-unit that can be translated and arranged repeatedly is not included in the minimum repeating region.

For example, in some examples, the center of the first color sub-pixel block 111 is located on the perpendicular bisector of the first edge 1101 and has the distance between the center of the first color sub-pixel block 111 and the first edge 1101 is ½ to ¾ of the length of the second edge 1102.

It should be noted that, upon the pixel arrangement structure being designed, the sub-pixel block (for example, the first color sub-pixel block, the second color sub-pixel block or the third color sub-pixel block) is usually designed to have a regular shape of, for example, a hexagon, a pentagon, a trapezoid, and the like. In design, the center of the sub-pixel block may be a geometric center of the above-described regular shape. However, in an actual manufacturing process, the shape of the formed sub-pixel block usually has certain deviation from the regular shape as designed above. For example, respective corners of the above-described regular shape may become rounded, so the shape of the sub-pixel block (for example, the first color sub-pixel block, the second color sub-pixel block or the third color sub-pixel block) may be a rounded shape. In addition, the shape of the actually manufactured sub-pixel block may further have other variations from the designed shape. For example, the shape of the sub-pixel block designed as a hexagon may become an approximate ellipse in actual fabrication. Therefore, the center of the sub-pixel block may not be the strict geometric center of the irregular shape of the sub-pixel block manufactured. In the embodiment of the present disclosure, the center of the sub-pixel block may have a certain offset from the geometric center of the shape of the sub-pixel block. The center of the sub-pixel block refers to any point within a region enclosed by specific points on radiation line segments starting from the geometric center of the sub-pixel block to respective points of an edge of the sub-pixel block, and the specific point on the radiation line segment is located at a distance of ⅓ the length of the radiation line segment from the geometric center. A definition of the center of the sub-pixel block is applicable to the center of the shape of the regular-shaped sub-pixel block, and is also applicable to the center of the irregular-shaped sub-pixel block.

In addition, as described above, due to various fabrication errors, the shape of the actually manufactured sub-pixel block may deviate from the shape of the designed sub-pixel block. Therefore, in the present disclosure, a certain error is allowed in a position of the center of the sub-pixel block as well as a relationship between the center of the sub-pixel block and a position of any other object. For example, with respect to a line connecting centers of sub-pixel blocks or a line passing through the center of the sub-pixel block, if the line satisfies other corresponding definitions (for example, an extension direction), the line only has to pass through the region enclosed by the specific points of the radiation line segments as described above. For another example, if the center of the sub-pixel block is located on a certain line, it refers to that the line only has to pass through the region enclosed by the specific points of the radiation line segments as described above.

For example, in some examples, the first color sub-pixel block 111, the second color sub-pixel block 112 and the third color sub-pixel block 113 may separately serve as one sub-pixel for display; and the first color sub-pixel block 111, the second color sub-pixel block 112 and the third color sub-pixel block 113 in the first virtual rectangle 110 may constitute a pixel unit for color display. Of course, the embodiment of the present disclosure includes, but is not limited thereto, and the first color sub-pixel block 111, the second color sub-pixel block 112 and the third color sub-pixel block 113 may be respectively combined with an adjacent same color sub-pixel into one sub-pixel for display.

For example, in some examples, the first color sub-pixel block is a sensitive color sub-pixel. Because sensitivity of human eyes to colors is varied, upon adjacent sensitive color sub-pixels being closer to each other, it is likely that the adjacent two sensitive color sub-pixels are difficult to distinguish and are visually combined into one by the human eyes due to a closer distance between the adjacent sensitive color sub-pixels. Thus, the pixel arrangement structure can improve distribution uniformity of sensitive color sub-pixels, so as to improve visual resolution and further improve display quality. It should be noted that, upon a red, green and blue (RGB) mode being used in the pixel arrangement structure, the above-described sensitive color is green.

For example, in some examples, the first color sub-pixel block is a green sub-pixel, the second color sub-pixel block is a red sub-pixel, and the third color sub-pixel block is a blue sub-pixel; or, the first color sub-pixel block is a green sub-pixel, the second color sub-pixel block is a blue sub-pixel, and the third color sub-pixel block is a red sub-pixel. Of course, the embodiment of the present disclosure includes, but is not limited thereto.

For example, in some examples, a distance between an edge of the first color sub-pixel block 111 that is close to the first edge 1101 and the first edge 1101 is ⅓ to 5/12 of the length of the second edge 1102. Therefore, a distance between two closest edges of adjacent two first color sub-pixel blocks is larger than ⅙ of the length of the second edge.

For example, in some examples, a distance between the center of the first color sub-pixel block and the first edge is 9/16 to 11/16 of the length of the second edge. Thus, distribution uniformity of first color sub-pixel blocks can be further improved, so as to further improve visual resolution and further improve display quality.

For example, in some examples, the distance between the center of the first color sub-pixel block and the first edge is ⅝ of the length of the second edge. Thus, distribution uniformity of first color sub-pixel blocks can be further improved, so as to further improve visual resolution and further improve display quality.

For example, in some examples, the above-described virtual rectangle may be a square, that is to say, the first edge and the second edge are equal in length.

For example, in some examples, as illustrated by FIG. 1, each of the plurality of minimum repeating regions 100 further includes a second virtual rectangle 120, a third virtual rectangle 130 and a fourth virtual rectangle 140. The first virtual rectangle 110, the second virtual rectangle 120, the third virtual rectangle 130 and the fourth virtual rectangle 140 form a 2*2 matrix in an edge-sharing manner to constitute one of the plurality of minimum repeating regions 100; the second virtual rectangle 120 shares the first edge 1101 with the first virtual rectangle, and is mirror-symmetrical to the first virtual rectangle with respect to the first edge 1101; the first virtual rectangle 110 coincides with the third virtual rectangle 130 by shifting a distance of a length of a diagonal line of the first virtual rectangle 110 along the diagonal line; the third virtual rectangle 130 includes a third edge 1303 extending in the first direction, and the fourth virtual rectangle 140 shares the third edge 1303 with the third virtual rectangle 130, and is mirror-symmetrical to the third virtual rectangle 130 with respect to the third edge 1303. It should be noted that, the first virtual rectangle, the second virtual rectangle, the third virtual rectangle and the fourth virtual rectangle are closely arranged to form the minimum repeating region having a rectangular shape. It should be noted that, the above-described word "coincide" refers to that three sub-pixel blocks in the third virtual rectangle have same shapes and positions as the three sub-pixel blocks in the first virtual rectangle translated along the diagonal line of the first virtual rectangle for the length of the diagonal line. Here, the word "coincide" only refers to that the pixel blocks coincide with each other, while other structures may be different or the same. In addition, the above-described word "coincide" refers to that approximate positions, shapes and sizes only have to be similar; and in some cases, the shapes may be slightly different for the sake of wiring or opening, for example, opening at different positions. Furthermore, corresponding sub-pixels or sub-pixel blocks or other components in virtual rectangles only need to have at least 70% of an area overlapped so as to be deemed to "coincide" as described in the present disclosure; and corresponding sub-pixels or sub-pixel blocks in virtual rectangles only need to have at least 70% of an area overlapped after a mirroring operation so as to be deemed to "be mirror-symmetrical" as described in the present disclosure.

In the pixel arrangement structure provided by this embodiment, the second virtual rectangle is mirror-symmetrical to the first virtual rectangle, a structure of the third virtual rectangle is the same as a structure of the first virtual rectangle translated along the diagonal line of the first virtual rectangle, the fourth virtual rectangle is mirror-symmetrical to the third virtual rectangle; a distance between a center of a first color sub-pixel block in the third virtual rectangle and the third edge is ½ to ¾ of the length of the second edge, and a distance between a center of a first color sub-pixel block in the fourth virtual rectangle and the third edge is ½ to ¾ of the length of the second edge, so a distance between the center of the first color sub-pixel block in the third virtual rectangle and the center of the first color sub-pixel block in the fourth virtual rectangle is greater than ½ of the length of the second edge, which, thus, can avoid a case where adjacent two first color sub-pixel blocks are difficult to distinguish and are visually combined into one by human eyes due to a closer distance between the adjacent first color sub-pixel blocks, so that granular sensation generated thereby can be avoided. Thus, the pixel arrangement structure can improve distribution uniformity of first color sub-pixel blocks, so as to improve visual resolution and also improve display quality.

In addition, as illustrated by FIG. 1, the distance between the center of the first color sub-pixel block in the first virtual rectangle and the first edge is ½ to ¾ of the length of the second edge, the distance between the center of the first color sub-pixel block in the fourth virtual rectangle and the third edge is ½ to ¾ of the length of the second edge, and a slope between a connecting line between the first color sub-pixel block in the first virtual rectangle and the first color sub-pixel block in the fourth virtual rectangle is relatively low; so upon pixel units belonging to a same row (for example, the first virtual rectangle and the fourth virtual rectangle) collectively displaying a straight line, because the slope of the connection line between the first color sub-pixel block in the first virtual rectangle and the first color sub-pixel block in the fourth virtual rectangle is relatively low, a fluctuation range of the first color sub-pixel block in the first virtual rectangle and the first color sub-pixel block in the fourth virtual rectangle is relatively small, which, thus, can avoid a case where two straight lines displayed by adjacent rows are difficult to distinguish and are visually combined into one by human eyes due to mutual occlusion of the two straight lines resulted from a relatively large fluctuation range. Thus, the pixel arrangement structure can improve visual resolution.

In addition, in the pixel arrangement structure, the second virtual rectangle is mirror-symmetrical to the first virtual rectangle, the structure of the third virtual rectangle is the same as the structure of the first virtual rectangle translated along the diagonal line of the first virtual rectangle, and the fourth virtual rectangle is mirror-symmetrical to the third virtual rectangle, which can improve distribution uniformity of sub-pixels in the pixel arrangement structure, and can also avoid formation of a color line. In addition, within the minimum repeating region 100, there is no color mixing problem in same color sub-pixels, and a second color sub-pixel block 112 in the first virtual rectangle 110 is closer to a second color sub-pixel block 112 in the second virtual rectangle 120, so upon the pixel arrangement structure being applied to an organic light-emitting display device, a light-emitting layer of the second color sub-pixel block 112 in the first virtual rectangle 110 and a light-emitting layer of the second color sub-pixel block 112 in the second virtual rectangle 120 may be formed through the same opening on a mask plate; similarly, upon the pixel arrangement structure being applied to an organic light-emitting display device, because a third color sub-pixel block 113 in the first virtual rectangle 110 is closer to a third color sub-pixel block 113 in the second virtual rectangle 120, a light-emitting layer of the third color sub-pixel block 113 in the first virtual rectangle 110 and a light-emitting layer of the third color sub-pixel block 113 in the second virtual rectangle 120 may also be formed through the same opening on a mask.

For example, in some examples, the first color sub-pixel block 111, the second color sub-pixel block 112 and the third color sub-pixel block 113 in the second virtual rectangle 120 may constitute one pixel unit for color display; the first color sub-pixel block 111, a second color sub-pixel block 112 and a third color sub-pixel block 113 in the third virtual rectangle 130 may constitute one pixel unit for color display; and the first color sub-pixel block 111, a second color sub-pixel block 112 and a third color sub-pixel block 113 in the fourth virtual rectangle 140 may constitute one pixel unit for color display.

In the pixel arrangement structure provided by this embodiment, because the second color sub-pixel block and the third color sub-pixel block are distributed on two sides of the perpendicular bisector of the first edge, and the center of the first color sub-pixel block is located on the perpendicular bisector of the first edge and the distance between the center of the first color sub-pixel block and the first edge which is ½ to ¾ of the length of the second edge; a distance between centers of adjacent two first color sub-pixel blocks is larger than ½ of the length of the second edge, which, thus, can avoid a case where the adjacent two first color sub-pixel blocks are difficult to distinguish and are visually combined into one by human eyes due to a closer distance between the adjacent first color sub-pixel blocks, so that granular sensation generated thereby can be avoided. Thus, the pixel arrangement structure can improve distribution uniformity of first color sub-pixel blocks, so as to improve visual resolution and also improve display quality.

For example, in some examples, as illustrated by FIG. 1, within the first virtual rectangle 110, the second color sub-pixel block 112 and the third color sub-pixel block 113 are respectively close to two ends of the first edge 1101. It should be noted that, according to the above-described relationship of the second virtual rectangle, the third virtual rectangle and the fourth virtual rectangle with the first virtual rectangle, a positional relationship between the second color sub-pixel block and the third color sub-pixel block in the second virtual rectangle, the third virtual rectangle and the fourth virtual rectangle also change accordingly. For example, as illustrated by FIG. 1, in the fourth virtual rectangle 140, a distance between the center of the first color sub-pixel block 111 and an upper edge of the fourth virtual rectangle 140 (equivalent to the first edge 1101 in the first virtual rectangle 110) is ½ to ¾ of the length of the second edge.

For example, in some examples, as illustrated by FIG. 1, within the first virtual rectangle 110, edges of the second color sub-pixel block 112 and the third color sub-pixel block 113 that are away from a center of the first virtual rectangle 110 are located on the first edge, so that space within the first virtual rectangle can be utilized to the greatest extent. It should be noted that, according to the above-described relationship of the second virtual rectangle, the third virtual rectangle and the fourth virtual rectangle with the first virtual rectangle, the positional relationship between the second color sub-pixel block and the third color sub-pixel block in the second virtual rectangle, the third virtual rectangle and the fourth virtual rectangle also change accordingly.

For example, in some examples, as illustrated by FIG. 1, shortest distances among the first color sub-pixel block 111, the second color sub-pixel block 112 and the third color sub-pixel block 113 are equal to one another. That is to say, a shortest distance between the first color sub-pixel block 111 and the second color sub-pixel block 112, a shortest distance between the first color sub-pixel block 111 and the third color sub-pixel block 113, and a shortest distance between the second color sub-pixel block 112 and the third color sub-pixel block 113 are equal to one another, so that process precision can be utilized to the greatest extent.

For example, in some examples, as illustrated by FIG. 1, the shape of the second color sub-pixel block 112 is the same as the shape of the third color sub-pixel block 113, and the shape of the second color sub-pixel block 112 and the shape of the third color sub-pixel block 113 are symmetrical to each other with respect to a diagonal line of the shape of the first color sub-pixel block 111, which is located between right angles formed by a first connection line and a second connection line. Thus, symmetry and uniformity of the pixel arrangement structure may be further improved, so as to further improve display quality.

For example, in some examples, as illustrated by FIG. 1, the shape of the first color sub-pixel block 111 is a right-base-angle symmetrical pentagon; the right-base-angle symmetrical pentagon is symmetrical with respect to the perpendicular bisector of the first edge 1101; and a base of the right-base-angle symmetrical pentagon is parallel to the first edge 1101 or is located on the first edge 1101, and is further away from the first edge 1101 than a vertex of the rightbase-angle symmetrical pentagon in a direction perpendicular to the first edge 1101. As illustrated by FIG. 1, two oblique edges of the first color sub-pixel block 111 may be provided respectively opposite to the second color sub-pixel block 112 and the third color sub-pixel block 113, so that in a case where process precision is constant, that is to say, in a case where distances from the first color sub-pixel block 111 respectively to the second color sub-pixel block 112 and the third color sub-pixel block 113 are constant, an area of the first color sub-pixel block 111 is increased. Thus, the pixel arrangement structure can improve a utilization ratio of space within the first virtual rectangle. It should be noted that, the above-described expression "be provided opposite" refers to that the two oblique edges of the first color sub-pixel block 111 respectively face the second color sub-pixel block 112 and the third color sub-pixel block 113.

For example, in some examples, as illustrated by FIG. 1, the shapes of the second color sub-pixel block 112 and the third color sub-pixel block 113 are both right-base-angle symmetrical pentagons; the right-base-angle symmetrical pentagons are symmetrical to each other with respect to the perpendicular bisector of the first edge; and bases of the right-base-angle symmetrical pentagons are parallel to the first edge 1101 or are located on the first edge 1101, and are closer to the first edge 1101 than the vertexes of the right-base-angle symmetrical pentagons in the direction perpendicular to the first edge 1101. As illustrated by FIG. 1, oblique edges of the second color sub-pixel block 112 and the third color sub-pixel block 113 that are close to the first color sub-pixel block 111 may be respectively opposite to the first color sub-pixel block 111, so that in a case where process precision is constant, that is to say, in the case where the distances from the first color sub-pixel block 111 respectively to the second color sub-pixel block 112 and the third color sub-pixel block 113 are constant, areas of the second color sub-pixel block 112 and the third color sub-pixel block 113 are increased. Thus, the pixel arrangement structure can improve the utilization ratio of the space within the first virtual rectangle.

For example, a distance between adjacent edges of two first color sub-pixel blocks is greater than or equal to 12 microns, or greater than or equal to 14 microns. As illustrated by FIG. 1, two first color sub-pixel blocks in each minimum repeating region, for example, refer to one first color sub-pixel block in a fourth virtual rectangle 140 and one first color sub-pixel block in a third virtual rectangle 130. Adjacent edges of the two first color sub-pixel blocks are just an edge of a lower side of the upper first color sub-pixel block and an edge of an upper side of the lower first color sub-pixel block. The above-described distance between the two first color sub-pixel blocks can be set to different numerical values according to different resolution conditions. For example, the distance between the adjacent edges of the two first color sub-pixel blocks is greater than or equal to 12 microns in a case of quarter full high definition resolution, and is greater than or equal to 14 microns in a case of full high definition resolution.

Figure 2:
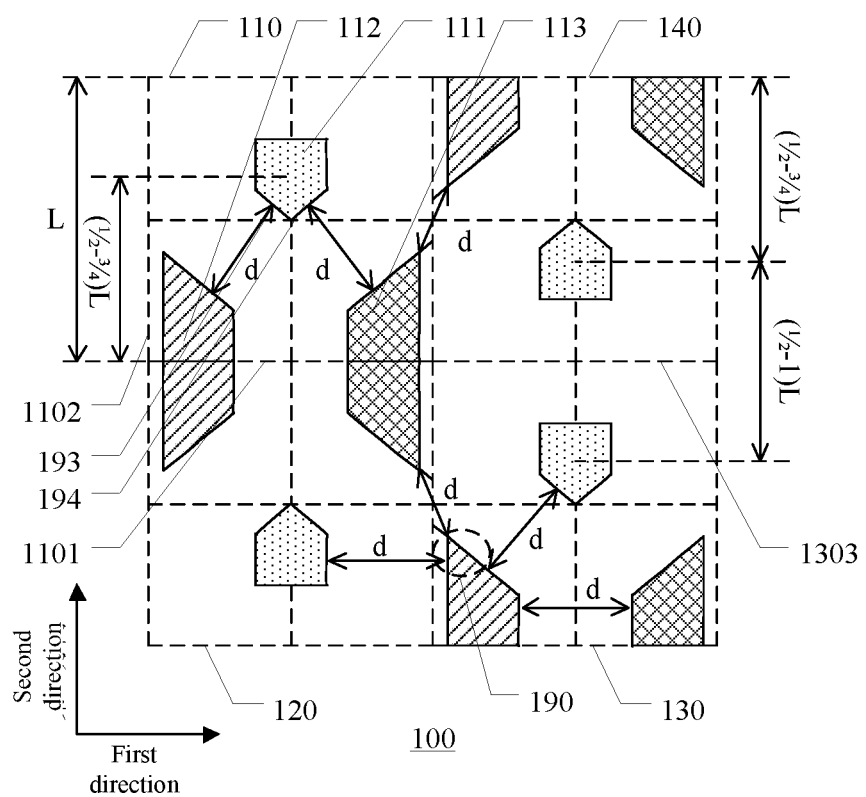
FIG. 2 is a schematic diagram of another pixel arrangement structure provided by an embodiment of the present disclosure.

FIG. 2 is a schematic diagram of another pixel arrangement structure provided by an embodiment of the present disclosure. As illustrated by FIG. 2, shapes of a second color sub-pixel block 112 and a third color sub-pixel block 113 are both right-angled trapezoids; bases of the right-angled trapezoids are perpendicular to a first edge 1101; and a distance between a right-angle edge of the right-angled trapezoid and the first edge 1101 is smaller than a distance between an oblique edge of the right-angled trapezoid and the first edge 1101. As illustrated by FIG. 2, the oblique edges of the second color sub-pixel block 112 and the third color sub-pixel block 113 may be respectively opposite to a first color sub-pixel block 111, so that in a case where process precision is constant, that is to say, in a case where distances from the first color sub-pixel block 111 respectively to the second color sub-pixel block 112 and the third color sub-pixel block 113 are constant, areas of the second color sub-pixel block 112 and the third color sub-pixel block 113 are increased. Thus, the pixel arrangement structure can improve a utilization ratio of space within a first virtual rectangle. Moreover, because the shapes of the second color sub-pixel block 112 and the third color sub-pixel block 113 are both right-angled trapezoids: as compared with a case where the shapes of the second color sub-pixel block 112 and the third color sub-pixel block 113 are both right-base-angle symmetrical pentagons, acute angle portions 190 of the second color sub-pixel block 112 and the third color sub-pixel block 113 may further increase the areas of the second color sub-pixel block 112 and the third color sub-pixel block 113, so as to further improve the utilization ratio of the space within the first virtual rectangle.

For example, in some examples, as illustrated by FIG. 2, a shape of the first color sub-pixel block 111 is a right-base-angle symmetrical pentagon; the right-base-angle symmetrical pentagon is symmetrical with respect to a perpendicular bisector of the first edge; a base of the right-base-angle symmetrical pentagon is parallel to the first edge 1101, and is further away from the first edge than a vertex of the right-base-angle symmetrical pentagon in a direction perpendicular to the first edge; the right-base-angle symmetrical pentagon includes a third oblique edge 193 and a fourth oblique edge 194 passing through the vertex of the right-base-angle symmetrical pentagon; the third oblique edge 193 and the fourth oblique edge 194 are equal in length; the third oblique edge 193 of the first color sub-pixel block 111 and the oblique edge of the second color sub-pixel block 112 are parallel to each other and have a spacing of a fifth distance; and the fourth oblique edge 194 of the first color sub-pixel block 111 and the oblique edge of the third color sub-pixel block are parallel to each other and have a spacing of a sixth distance.

For example, in some examples, as illustrated by FIG. 2, within a first virtual rectangle 110 and a second virtual rectangle 120, third color sub-pixel blocks 113 are closer to a center of a minimum repeating region 100 than second color sub-pixel blocks 112; within a third virtual rectangle 130 and a fourth virtual rectangle 140, second color sub-pixel blocks 112 are closer to the center of the minimum repeating region 100 than third color sub-pixel blocks 113; a third color sub-pixel block 113 in the first virtual rectangle 110 is adjacent to a second color sub-pixel block 112 in the fourth virtual rectangle 140; a third color sub-pixel block 113 in the second virtual rectangle 120 is adjacent to a second color sub-pixel block 112 in the third virtual rectangle 130; a spacing between an acute angle portion 190 of the third color sub-pixel block 113 in the first virtual rectangle 110 and an acute angle portion 190 of the second color sub-pixel block 112 in the fourth virtual rectangle 140 is a seventh distance; and a spacing between an acute angle portion 190 of the third color sub-pixel block 113 in the second virtual rectangle 120 and an acute angle portion 190 of the second color sub-pixel block 112 in the third virtual rectangle 130 is an eighth distance.

For example, in some examples, as illustrated by FIG. 2, the fifth distance, the sixth distance, the seventh distance and the eighth distance are all equal to one another.

For example, as illustrated in FIG. 2, a distance between a third color sub-pixel block and a first color sub-pixel block that are adjacent to each other is equal to a distance between a third color sub-pixel block and a second color sub-pixel block that are adjacent to each other, both being distance d. In some examples, a distance between a first color sub-pixel block and a second color sub-pixel block that are adjacent to each other is also equal to the above-described distance d.

For example, in some examples, as illustrated by FIG. 2, the second color sub-pixel block and the third color sub-pixel block may also have an asymmetrical shape which, for example, is asymmetrical with respect to a straight line passing through its center in a second direction.

Figure 3:
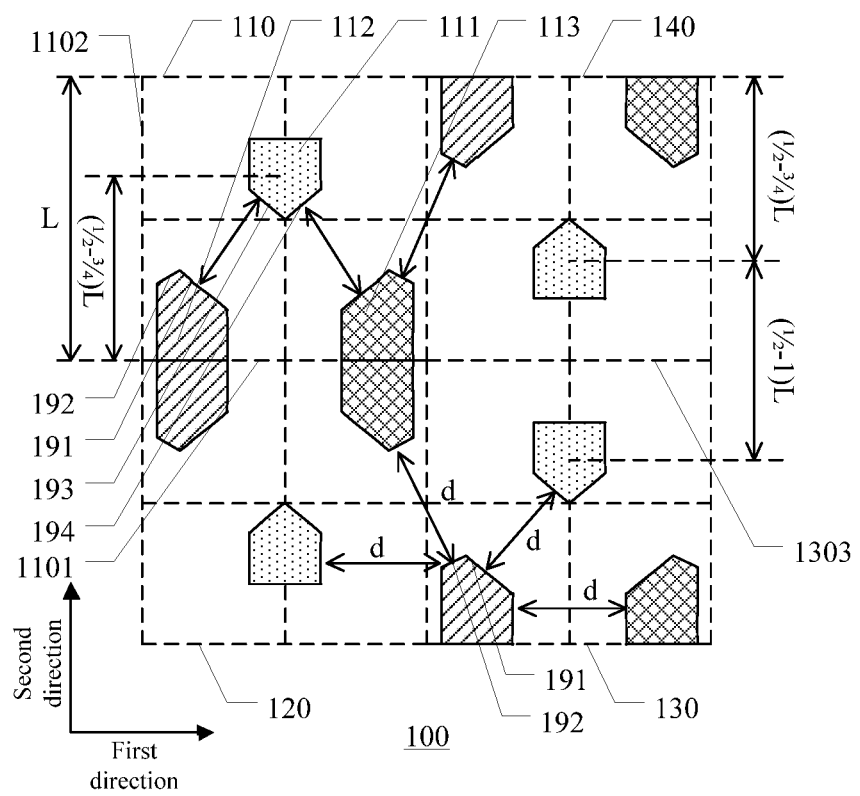
FIG. 3 is a schematic diagram of another pixel arrangement structure provided by an embodiment of the present disclosure.

FIG. 3 is a schematic diagram of another pixel arrangement structure provided by an embodiment of the present disclosure. As illustrated by FIG. 3, shapes of a second color sub-pixel block 112 and a third color sub-pixel block 113 are both right-base-angle pentagons; bases of the right-base-angle pentagons are parallel to a first edge 1101 or are located on the first edge 1101, and are closer to the first edge 1101 than vertexes of the right-base-angle pentagons in a direction perpendicular to the first edge 1101; the right-base-angle pentagon includes a first oblique edge 191 and a second oblique edge 192 passing through the vertex; the first oblique edge 191 is opposite to a first color sub-pixel block 111; and a length of the first oblique edge 191 is larger than a length of the second oblique edge 192. For example, a first oblique edge 191 of the second color sub-pixel block 112 is opposite to the first color sub-pixel block 111, and a first oblique edge 191 of the third color sub-pixel block 113 is opposite to the first color sub-pixel block 111, so that in a case where process precision is constant, that is to say, in a case where distances from the first color sub-pixel block 111 respectively to the second color sub-pixel block 112 and the third color sub-pixel block 113 are constant, areas of the second color sub-pixel block 112 and the third color sub-pixel block 113 are increased, so as to improve a utilization ratio of space within a first virtual rectangle. Moreover, because the shapes of the second color sub-pixel block 112 and the third color sub-pixel block 113 are both right-base-angle pentagons: as compared with a case where the shapes of the second color sub-pixel block 112 and the third color sub-pixel block 113 are both right-base-angle symmetrical pentagons, regions where the second oblique edges 192 of the second color sub-pixel block 112 and the third color sub-pixel block 113 are located may further increase the areas of the second color sub-pixel block 112 and the third color sub-pixel block 113, so as to further improve the utilization ratio of the space within the first virtual rectangle; and as compared with a case where the shapes of the second color sub-pixel block 112 and the third color sub-pixel block 113 are both right-angled trapezoids, the second oblique edges 192 of the second color sub-pixel block 112 and the third color sub-pixel block 113 can have a fabrication difficulty reduced, and in case where a technological level is relatively low, the shapes of the second color sub-pixel block and the third color sub-pixel block may be right-base-angle pentagons.

For example, in some examples, as illustrated by FIG. 3, a shape of the first color sub-pixel block 111 is a right-base-angle symmetrical pentagon; the right-base-angle symmetrical pentagon is symmetrical with respect to a perpendicular bisector of the first edge; a base of the right-base-angle symmetrical pentagon is parallel to the first edge or is located on the first edge, and is further away from the first edge than the vertex of the right-base-angle symmetrical pentagon in the direction perpendicular to the first edge; the right-base-angle symmetrical pentagon includes a third oblique edge 193 and a fourth oblique edge 194 passing through the vertex of the right-base-angle symmetrical pentagon; the third oblique edge 193 and the fourth oblique edge 194 are equal in length; the third oblique edge 193 of the first color sub-pixel block 111 and the first oblique edge 191 of the second color sub-pixel block 112 are parallel to each other and have a spacing of a first distance; and the fourth oblique edge 194 of the first color sub-pixel block 111 and the first oblique edge 191 of the third color sub-pixel block are parallel to each other and have a spacing of a second distance. It should be noted that, the above-described case of "being parallel" includes a case of being substantially parallel; and the above-described distance refers to a minimum distance, or a distance between two intersection points formed as a line connecting centers of two sub-pixels respectively intersects with two closest edges of the two sub-pixels.

For example, in some examples, as illustrated by FIG. 3, within the first virtual rectangle 110 and a second virtual rectangle 120, third color sub-pixel blocks 113 are closer to a center of a minimum repeating region 100 than second color sub-pixel blocks 112; within a third virtual rectangle 130 and a fourth virtual rectangle 140, second color sub-pixel blocks 112 are closer to the center of the minimum repeating region 100 than third color sub-pixel blocks 113; the third color sub-pixel block 113 in the first virtual rectangle 110 is adjacent to a second color sub-pixel block 112 in the fourth virtual rectangle 140; a third color sub-pixel block 113 in the second virtual rectangle 120 is adjacent to a second color sub-pixel block 112 in the third virtual rectangle 130; the second oblique edge 192 of the third color sub-pixel block 113 in the first virtual rectangle 110 and a second oblique edge 192 of the second color sub-pixel block 112 in the fourth virtual rectangle 140 are parallel to each other and have a spacing of a third distance; and a second oblique edge 192 of the third color sub-pixel block 113 in the second virtual rectangle 120 and a second oblique edge 192 of the second color sub-pixel block 112 in the third virtual rectangle 130 are parallel to each other and have a spacing of a fourth distance.

For example, in some examples, the first distance, the second distance, the third distance and the fourth distance as described above are all equal to one another, so that a utilization ratio of process precision can be improved.

Figure 4:
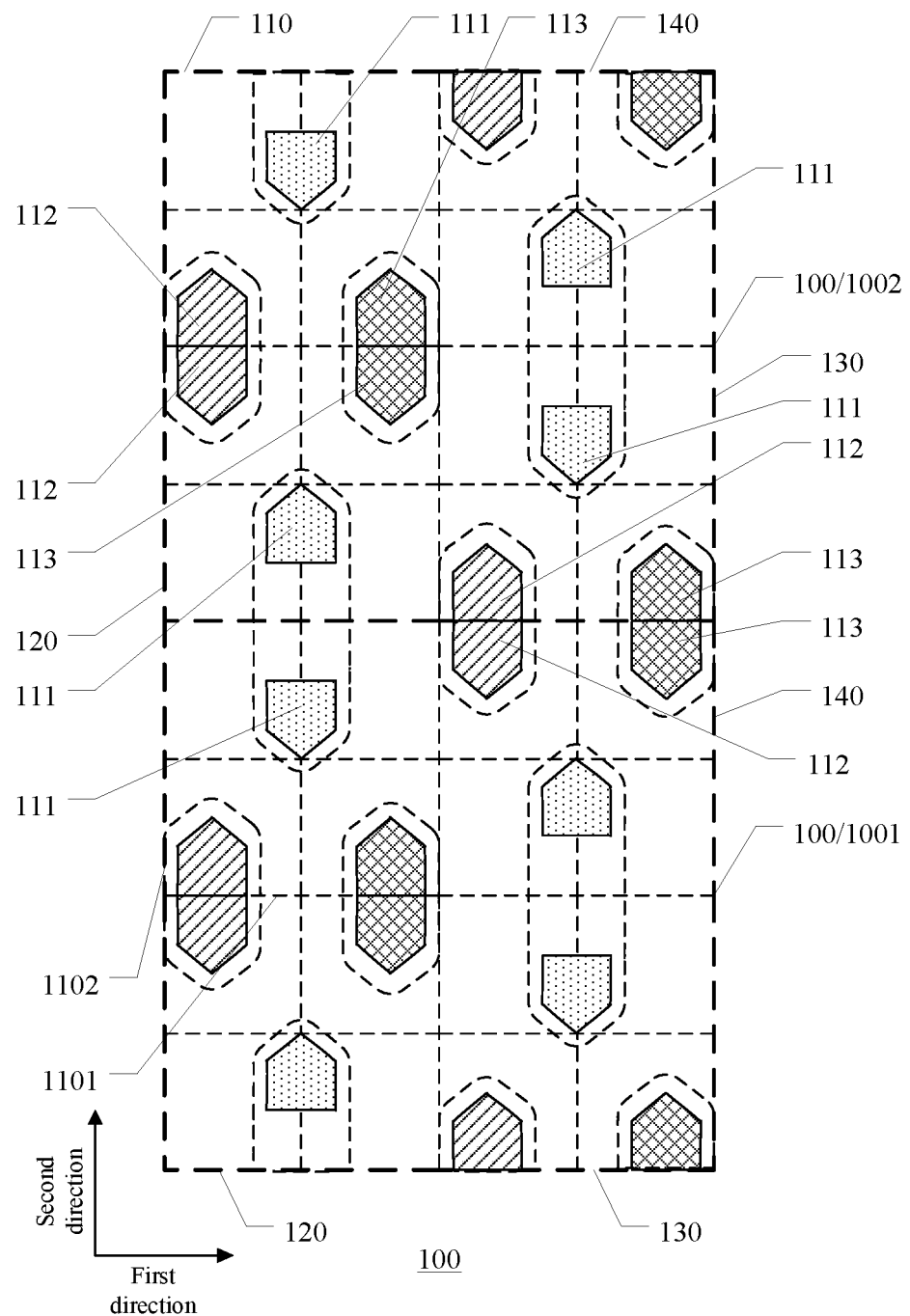
FIG. 4 is a schematic diagram of another pixel arrangement structure provided by an embodiment of the present disclosure.

FIG. 4 is a schematic diagram of another pixel arrangement structure provided by an embodiment of the present disclosure. FIG. 4 shows two minimum repeating regions 100; as illustrated by FIG. 4, within the same minimum repeating region 100, a second color sub-pixel block 112 of a first virtual rectangle 110 and a second color sub-pixel block 112 of a second virtual rectangle 120 are combined into a same sub-pixel; within two minimum repeating regions 100 adjacent to each other in a second direction, the adjacent two minimum repeating regions 100 in the second direction include a first minimum repeating region 1001 and a second minimum repeating region 1002 sequentially arranged in the second direction; and a second color sub-pixel block 112 of a fourth virtual rectangle 140 of the first minimum repeating region 1001 and a second color sub-pixel block 112 of a third virtual rectangle 130 of the second minimum repeating region 1002 are combined into a same sub-pixel. Thus, combination of second color sub-pixel blocks into a same sub-pixel can reduce difficulty in manufacturing process of the second color sub-pixel blocks. In addition, upon the pixel arrangement structure being used in a display panel, it may be driven by using a Sub-pixel Rendering (SPR) algorithm to implement virtual display.

It should be noted that, the second color sub-pixel block of the first virtual rectangle and the second color sub-pixel block of the second virtual rectangle within the same minimum repeating region that are combined into a same sub-pixel, or the second color sub-pixel block of the fourth virtual rectangle of the first minimum repeating region and the second color sub-pixel block of the third virtual rectangle of the second minimum repeating region that are combined into a same sub-pixel as described above are driven to emit light as a same sub-pixel. That is to say, the above-described second color sub-pixel blocks located in different virtual rectangles that are combined into a same sub-pixel serve only as a portion of one sub-pixel, and at this time, a center of the integrated sub-pixel is located on a first edge or on a shared edge of the adjacent two minimum repeating regions in the second direction.

For example, in some examples, as illustrated by FIG. 4, within the same minimum repeating region 100, a third color sub-pixel block 113 of the first virtual rectangle 110 and a third color sub-pixel block 113 of the second virtual rectangle 120 are combined into a same sub-pixel; within the two minimum repeating regions 100 adjacent to each other in the second direction, the adjacent two minimum repeating regions 100 in the second direction include the first minimum repeating region 1001 and the second minimum repeating region 1002 sequentially arranged in the second direction; and a third color sub-pixel block 113 of the fourth virtual rectangle 140 of the first minimum repeating region 1001 and a third color sub-pixel block 113 of the third virtual rectangle 130 of the second minimum repeating region 1002 are combined into a same sub-pixel. Thus, combination of third color sub-pixel blocks into a same sub-pixel can reduce a difficulty in manufacturing process of the third color sub-pixel blocks. In addition, when the pixel arrangement structure is used in a display panel, it may be driven by using a Sub-pixel Rendering (SPR) algorithm to implement virtual display.

It should be noted that, the third color sub-pixel block of the first virtual rectangle and the third color sub-pixel block of the second virtual rectangle within the same minimum repeating region that are combined into a same sub-pixel, or the third color sub-pixel block of the fourth virtual rectangle of the first minimum repeating region and the third color sub-pixel block of the third virtual rectangle of the second minimum repeating region that are combined into a same sub-pixel as described above are driven to emit light as a same sub-pixel. That is to say, the above-described third color sub-pixel blocks located in different virtual rectangles that are combined into a same sub-pixel serve only as a portion of one sub-pixel, and at this time, a center of the integrated sub-pixel is located on the first edge or on the shared edge of the adjacent two minimum repeating regions in the second direction.

In addition, within the same one of the plurality of minimum repeating regions 100, the second color sub-pixel block 112 of the first virtual rectangle 110 and the second color sub-pixel block 112 of the second virtual rectangle 120 may not be combined into a same sub-pixel; within two adjacent ones of the plurality of minimum repeating regions 100 in the second direction, the two adjacent ones of the plurality of minimum repeating regions 100 in the second direction include a first minimum repeating region 1001 and a second minimum repeating region 1002 sequentially arranged in the second direction; and the second color sub-pixel block 112 of the fourth virtual rectangle 140 of the first minimum repeating region 1001 and the second color sub-pixel block 112 of the third virtual rectangle 130 of the second minimum repeating region 1002 may not be combined into a same sub-pixel. At this time, the second color sub-pixel block 112 of the first virtual rectangle 110 and the second color sub-pixel block 112 of the second virtual rectangle 120 are respectively driven to emit light as two second color sub-pixel blocks, and may share a same single color pattern region in a sub-pixel patterning process. The second color sub-pixel block 112 of the fourth virtual rectangle 140 of the first minimum repeating region 1001 and the second color sub-pixel block 112 of the third virtual rectangle 130 of the second minimum repeating region 1002 are respectively driven to emit light as two second color sub-pixel blocks, and may share a same single color pattern region in a sub-pixel patterning process.

In addition, within the same minimum repeating region 100, the third color sub-pixel block 113 of the first virtual rectangle 110 and the third color sub-pixel block 113 of the second virtual rectangle 120 may not be combined into a same sub-pixel; within the two minimum repeating regions 100 adjacent to each other in the second direction, the adjacent two minimum repeating regions 100 in the second direction include the first minimum repeating region 1001 and the second minimum repeating region 1002 sequentially arranged in the second direction; and the third color sub-pixel block 113 of the fourth virtual rectangle 140 of the first minimum repeating region 1001 and the third color sub-pixel block 113 of the third virtual rectangle 130 of the second minimum repeating region 1002 may not be combined into a same sub-pixel. At this time, the third color sub-pixel block 113 of the first virtual rectangle 110 and the third color sub-pixel block 113 of the second virtual rectangle 120 are respectively driven to emit light as two third color sub-pixel blocks, and may share a same single color pattern region in a sub-pixel patterning process. The third color sub-pixel block 113 of the fourth virtual rectangle 140 of the first minimum repeating region 1001 and the third color sub-pixel block 113 of the third virtual rectangle 130 of the second minimum repeating region 1002 are respectively driven to emit light as two third color sub-pixel blocks, and may share a same single color pattern region in a sub-pixel patterning process. For example, in some examples, as illustrated by FIG. 4, within the same minimum repeating region 100, a first color sub-pixel block 111 of the third virtual rectangle 130 and a first color sub-pixel block 111 of the fourth virtual rectangle 140 share a same single color pattern region in a sub-pixel patterning process. For example, when the pixel arrangement structure is applied to an organic light-emitting display device, the sub-pixel patterning process includes an evaporation process; and a light-emitting layer of the first color sub-pixel block 111 of the third virtual rectangle 130 and a light-emitting layer of the first color sub-pixel block 111 of the fourth virtual rectangle 140 may be formed through a same opening on a mask. Of course, the above-described sub-pixel patterning process includes, but is not limited to, an evaporation process, and may also include printing, a color filter patterning process, and so on. Thus, the first color sub-pixel block 111 of the third virtual rectangle 130 and the first color sub-pixel block 111 of the fourth virtual rectangle 140 share a same single color pattern region in a sub-pixel patterning process such as printing and a color filter patterning process.

For example, in some examples, as illustrated by FIG. 4, an organic light-emitting layer of the first color sub-pixel block 111 of the third virtual rectangle 130 and an organic light-emitting layer of the first color sub-pixel block 111 of the fourth virtual rectangle 140 are evaporated through a same opening on a fine metal mask.

For example, in some examples, as illustrated by FIG. 4, within the two minimum repeating regions 100 adjacent to each other in the second direction, the adjacent two minimum repeating regions 100 in the second direction include the first minimum repeating region 1001 and the second minimum repeating region 1002 sequentially arranged in the second direction; and a first color sub-pixel block 111 of the first virtual rectangle 110 of the first minimum repeating region 1001 and a first color sub-pixel block 111 of the second virtual rectangle 120 of the second minimum repeating region 1002 may share a same single color pattern region in a sub-pixel patterning process. For example, when the pixel arrangement structure is applied to an organic light-emitting display device, the sub-pixel patterning process includes an evaporation process; and a light-emitting layer of the first color sub-pixel block 111 of the first virtual rectangle 110 of the first minimum repeating region 1001 and a light-emitting layer of the first color sub-pixel block 111 of the second virtual rectangle 120 of the second minimum repeating region 1002 may be formed through a same opening on the mask, that is to say, the first color sub-pixel block 111 of the first virtual rectangle 110 of the first minimum repeating region 1001 and the first color sub-pixel block 111 of the second virtual rectangle 120 of the second minimum repeating region 1002 include the light-emitting layers formed through the same opening on the mask. Of course, the above-described sub-pixel patterning process includes, but is not limited to, an evaporation process, and may also include printing, a color filter patterning process, and so on. Thus, the first color sub-pixel block 111 of the first virtual rectangle 110 of the first minimum repeating region 1001 and the first color sub-pixel block 111 of the second virtual rectangle 120 of the second minimum repeating region 1002 share a same single color pattern region in a sub-pixel patterning process such as printing and a color filter patterning process. Therefore, combination of first color sub-pixel blocks into a same sub-pixel can reduce a process difficulty in fabricating the first color sub-pixel block.

For example, in some examples, as illustrated by FIG. 4, within the same minimum repeating region 100, a distance between a center of the second color sub-pixel block 112 and a center of the third color sub-pixel block 113 in the first virtual rectangle 110 ranges from 5/9 to 7/9 of the length of the first edge, so that it can be ensured that a distance from the third color sub-pixel blocks 113 of the first virtual rectangle 110 and the second virtual rectangle 120 to second color sub-pixel blocks 112 of a first virtual rectangle 110 and a second virtual rectangle 120 of an adjacent minimum repeating region in the first direction is sufficiently large, so that it is convenient to form the first color sub-pixel block 111 of the third virtual rectangle 130 and the first color sub-pixel block 111 of the fourth virtual rectangle 140 within the same minimum repeating region 100 through a same opening on the mask, and to form the first color sub-pixel block 111 of the first virtual rectangle 110 of the first minimum repeating region 1001 and the first color sub-pixel block 111 of the second virtual rectangle 120 of the second minimum repeating region 1002 through a same opening on the mask, so as to reduce a difficulty in process.

In addition, as viewed from a relationship between respective virtual rectangles and the minimum repeating region of FIG. 4, a step of the minimum repeating region in the first direction is approximately equal to edge lengths of two virtual rectangles, that is, the step of the minimum repeating region in the first direction is about 2L. As illustrated by FIG. 4, the second color sub-pixel block and the third color sub-pixel block in the first virtual rectangle 110 and the second color sub-pixel block and the third color sub-pixel block in the second virtual rectangle 120 may be combined into one second color sub-pixel block and one third color sub-pixel block, which, plus one first color sub-pixel block in the third virtual rectangle 130 and one first color sub-pixel block in the fourth virtual rectangle 130, may form a repeating unit. That is to say, a size of the repeating unit in the first direction or a step of the repeating unit in the first direction is twice the length of the edge of the virtual rectangle in the first direction. If the virtual rectangle is a square, then the step of the minimum repeating unit in the first direction is approximately 2L.

As can be seen from FIG. 4, the second color sub-pixel block and the third color sub-pixel block have elongated shapes, that is, elongated shapes extending in the second direction. In addition, the second color sub-pixel block and the third color sub-pixel block may also have elliptical shapes. With respect to the second color sub-pixel block, if it is divided into two portions (the two portions are, for example, the second color sub-pixel block located in the first virtual rectangle 110 and the second color sub-pixel block located in the second virtual rectangle) by a center line along the first direction, then a distance between centers of the two second color sub-pixel blocks is less than 0.3L. In addition, a size of the second color sub-pixel block in the second direction is less than 0.6L.

With respect to the second color sub-pixel block and the third color sub-pixel block, a ratio of a size in the second direction to a size in the first direction is y, and y>1. That is to say, the second color sub-pixel block and the third color sub-pixel block have elongated shapes extending in the second direction.

For example, the second color sub-pixel is a red sub-pixel, and the third color sub-pixel is a blue sub-pixel. A lifetime of the red sub-pixel is usually longer than that of the blue sub-pixel. Therefore, an area of the red sub-pixel may be smaller than an area of the blue sub-pixel; however, a ratio of a size in the first direction to a size in the second direction of the red sub-pixel cannot be too small; if it is too small, a marked difference between a lateral direction and a longitudinal direction may be affected.

Figure 5:
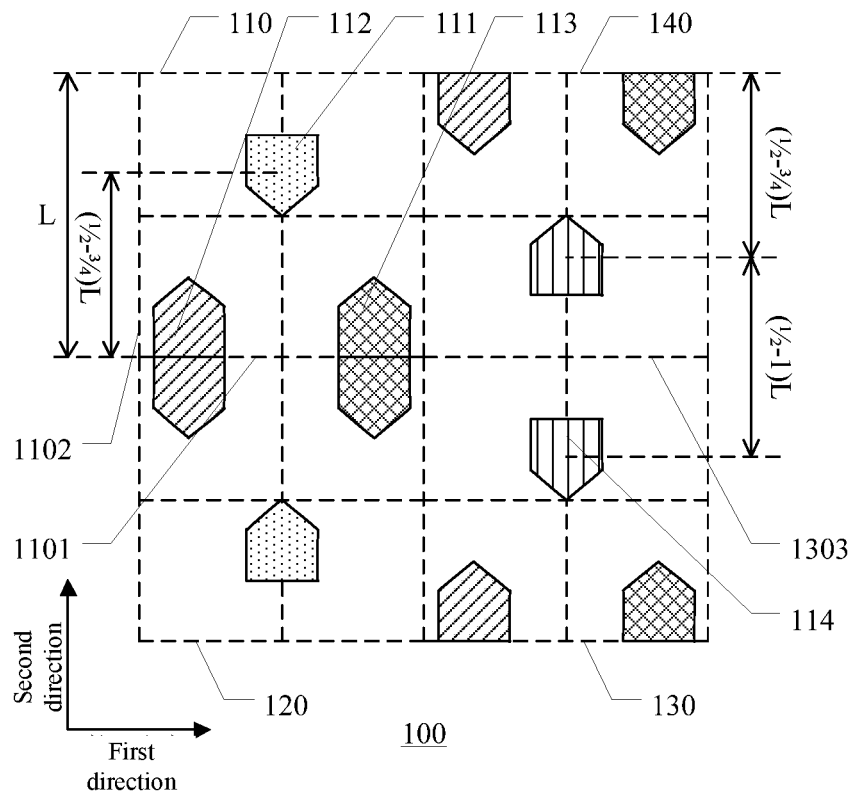
FIG. 5 is a schematic diagram of another pixel arrangement structure provided by an embodiment of the present disclosure.

FIG. 5 is a pixel arrangement structure provided by an embodiment of the present disclosure. As illustrated by FIG. 5, first color sub-pixel blocks 111 in a third virtual rectangle 130 and a fourth virtual rectangle 140 are replaced with fourth color sub-pixel blocks 114.

For example, the first color sub-pixel block 111 includes a green sub-pixel, and the fourth color sub-pixel block 114 includes a yellow sub-pixel. Therefore, a four-color mode of red, green, blue and yellow (RGBY) may be used in the pixel arrangement structure, so as to further improve display quality of the pixel arrangement structure.

Figure 6:
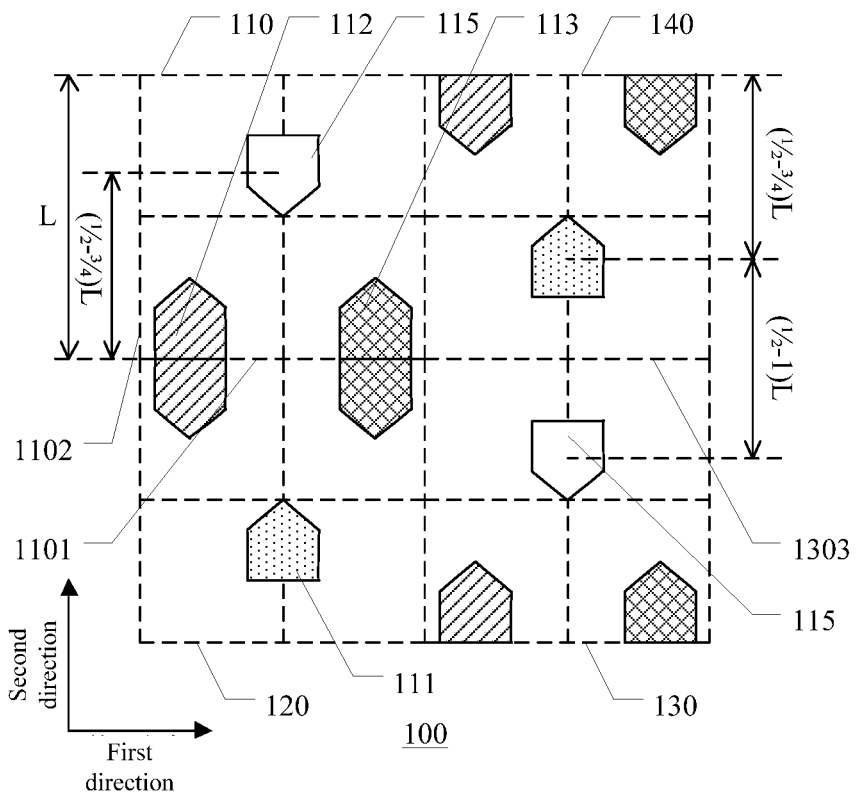
FIG. 6 is a schematic diagram of another pixel arrangement structure provided by an embodiment of the present disclosure.

FIG. 6 is a pixel arrangement structure provided by an embodiment of the present disclosure. As illustrated by FIG. 6, first color sub-pixel blocks 111 in a first virtual rectangle 110 and a third virtual rectangle 130 are replaced with fifth color sub-pixel blocks 115.

For example, the first color sub-pixel block 110 includes a green sub-pixel, and the fifth color sub-pixel block 115 includes a white sub-pixel. Therefore, a red, green, blue and white (RGBW) mode may be used in the pixel arrangement structure, so as to effectively improve brightness of the pixel arrangement structure and improve utilization efficiency of energy.

Figure 7:
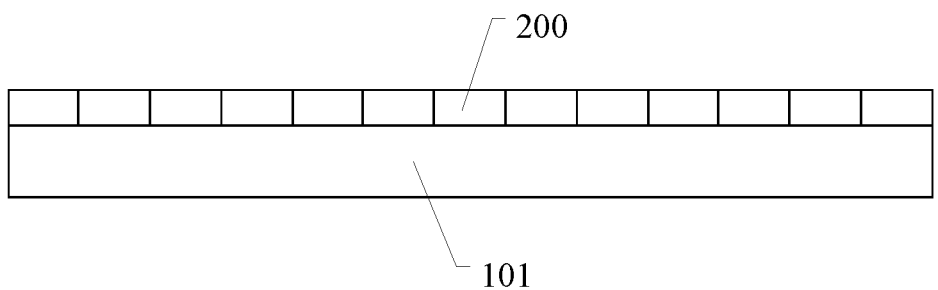
FIG. 7 is a structural schematic diagram of a display substrate provided by an embodiment of the present disclosure.

An embodiment of the present disclosure further provides a display substrate. FIG. 7 is the display substrate provided by the embodiment of the present disclosure. As illustrated by FIG. 7, the display substrate comprises a base substrate 101 and a plurality of pixels 200 arranged on the base substrate 101. The plurality of pixels 200 may adopt the pixel arrangement structure provided by any one of the above-described examples. Because the display substrate may adopt the pixel arrangement structure provided by any one of the above-described examples, the display substrate has advantageous effects of the pixel arrangement structure comprised therein, for example, the display substrate can improve uniformity of distribution of first color sub-pixel blocks, so as to improve visual resolution and also improve display quality.

Figure 8:
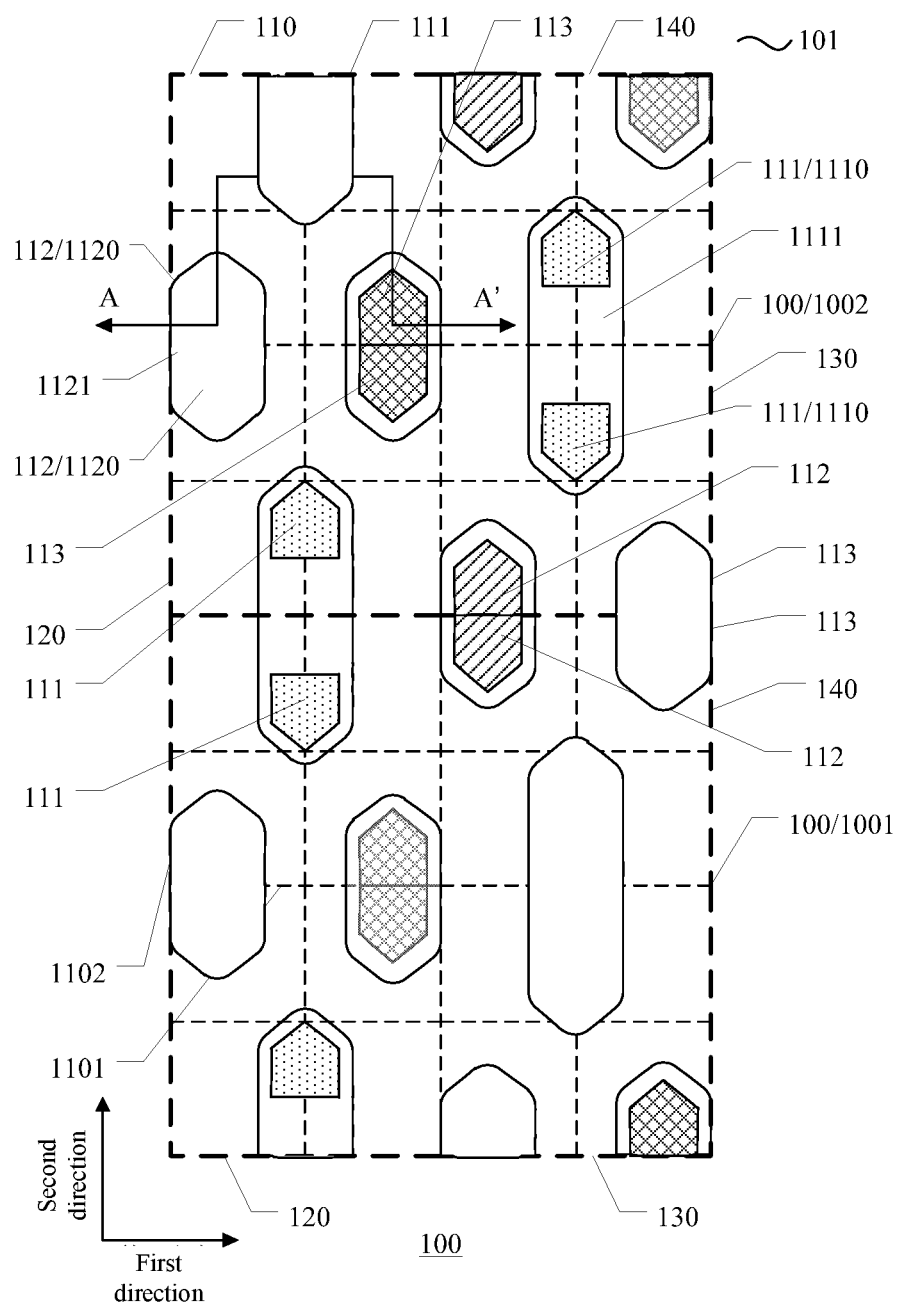
FIG. 8 is a partial schematic plan view of a display substrate provided by an embodiment of the present disclosure.
Figure 9:
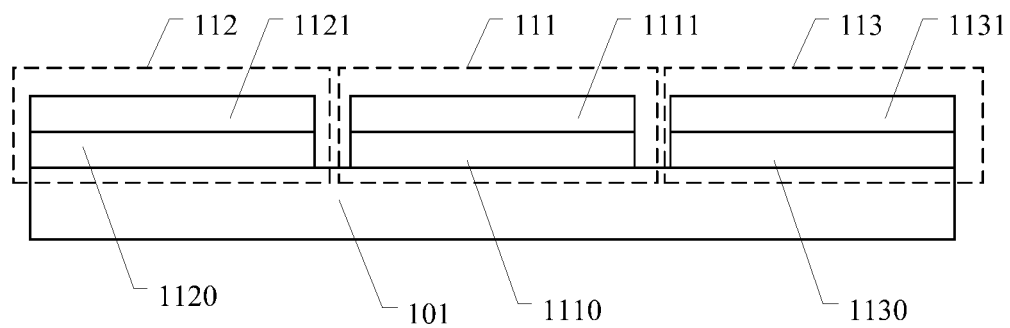
FIG. 9 is a cross-sectional schematic diagram of the display substrate taken along direction A-A' in FIG. 8 provided by the embodiment of the present disclosure.

FIG. 8 is a partial schematic plan view of another display substrate provided by an embodiment of the present disclosure. FIG. 9 is a cross-sectional schematic diagram of the display substrate taken along direction A-A' in FIG. 8 provided by the embodiment of the present disclosure. As illustrated by FIG. 8, a first color sub-pixel block 111 includes a first color pixel electrode 1110 and a first color light-emitting layer 1111 provided on the first color pixel electrode 1110, a second color sub-pixel block 112 includes a second color pixel electrode 1120 and a second color light-emitting layer 1121 provided on the second color pixel electrode 1120, and a third color sub-pixel block 113 includes a third color pixel electrode 1130 and a third color light-emitting layer 1131 provided on the third color pixel electrode 1130. Thus, the display substrate may be an array substrate.

For example, in some examples, the first color pixel electrode 1110 is configured to drive the first color light-emitting layer 1111 to emit light.

For example, a shape of the first color pixel electrode 1110 may be the same as a shape of the first color sub-pixel block 111. Of course, the embodiment of the present disclosure includes, but is not limited thereto, the shape of the first color pixel electrode 1110 may be different from the shape of the first color sub-pixel block 111, and the shape of the first color sub-pixel block 111 may be defined by a pixel defining layer.

It should be noted that, the shape of the above-described first color sub-pixel block is a shape of a light-emitting region of the first color sub-pixel block. In addition, a specific shape of the first color light-emitting layer may be set according to a preparation process, which will not be limited here in the embodiment of the present disclosure. For example, the shape of the first color light-emitting layer may be determined by a shape of an opening of a mask in the preparation process.

For example, the first color pixel electrode 1110 may be in contact with the first color light-emitting layer 1111, so that it can drive the light-emitting layer to emit light at a portion in contact with each other, and the portion where the first color pixel electrode 1110 and the first color light-emitting layer 1111 can be in contact with each other is an effective portion that a sub-pixel can emit light. Therefore, the shape of the above-described first color sub-pixel block is the shape of the light-emitting region of the first color sub-pixel block. In the embodiment of the present disclosure, the first color pixel electrode 1110 may be an anode, but is not limited to an anode, and a cathode of a light emitting diode may also be used as the pixel electrode.

For example, in some examples, the second color pixel electrode 1120 is configured to drive the second color light-emitting layer 1121 to emit light.

For example, a shape of the second color pixel electrode 1120 may be the same as a shape of the second color sub-pixel block 112. Of course, the embodiment of the present disclosure includes, but is not limited thereto, the shape of the second color pixel electrode 1120 may be different from the shape of the second color sub-pixel block 112, and the shape of the second color sub-pixel block 112 may be defined by a pixel defining layer.

It should be noted that, the shape of the above-described second color sub-pixel block is a shape of a light-emitting region of the second color sub-pixel block. In addition, a specific shape of the second color light-emitting layer may be set according to a preparation process, which will not be limited here in the embodiment of the present disclosure. For example, the shape of the second color light-emitting layer may be determined by a shape of an opening of a mask in the preparation process.

For example, the second color pixel electrode 1120 may be in contact with the second color light-emitting layer 1121, so that it can drive the light-emitting layer to emit light at a portion in contact with each other, and the portion where the second color pixel electrode 1120 and the second color light-emitting layer 1121 can be in contact with each other is an effective portion that a sub-pixel can emit light. Therefore, the shape of the above-described second color sub-pixel block is the shape of the light-emitting region of the second color sub-pixel block. In the embodiment of the present disclosure, the second color pixel electrode 1120 may be an anode, but is not limited to an anode, and a cathode of a light emitting diode may also be used as the pixel electrode.

For example, in some examples, the third color pixel electrode 1130 is configured to drive the third color light-emitting layer 1131 to emit light.

For example, a shape of the third color pixel electrode 1130 may be the same as a shape of the third color sub-pixel block 113. Of course, the embodiment of the present disclosure includes, but is not limited thereto, the shape of the third color pixel electrode 1130 may be different from the shape of the third color sub-pixel block 113, and the shape of the third color sub-pixel block 113 may be defined by a pixel defining layer.

It should be noted that, the shape of the above-described third color sub-pixel block is a shape of a light-emitting region of the third color sub-pixel block. In addition, a specific shape of the third color light-emitting layer may be set according to a preparation process, which will not be limited here in the embodiment of the present disclosure. For example, the shape of the third color light-emitting layer may be determined by a shape of an opening of a mask in the preparation process.

For example, the third color pixel electrode 1130 may be in contact with the third color light-emitting layer 1131, so that it can drive the light-emitting layer to emit light at a portion in contact with each other, and the portion where the third color pixel electrode 1130 and the third color light-emitting layer 1131 can be in contact with each other is an effective portion that a sub-pixel can emit light. Therefore, the shape of the above-described third color sub-pixel block is the shape of the light-emitting region of the third color sub-pixel block. In the embodiment of the present disclosure, the third color pixel electrode 1130 may be an anode, but is not limited to an anode, and a cathode of a light emitting diode may also be used as the pixel electrode.

It should be noted that, with respect to each sub-pixel, an area of a pixel electrode may be slightly larger than an area of a light-emitting layer, or the area of the light-emitting layer may also be slightly larger than the area of the pixel electrode, which will not be particularly limited in the embodiment of the present disclosure. For example, the light-emitting layer here may include an electroluminescent layer itself as well as other functional layers located on both sides of the electroluminescent layer, for example, a hole injection layer, a hole transport layer, an electron injection layer, an electron transport layer, and so on. In some embodiments, a shape of a sub-pixel may also be defined by a pixel defining layer. For example, a lower electrode (e.g., an anode) of a light emitting diode may be provided below the pixel defining layer; the pixel defining layer includes an opening for defining the sub-pixel; the opening exposes a portion of the lower electrode; and when a light-emitting layer is formed in the opening in the above-described pixel defining layer, the light-emitting layer is in contact with the lower electrode, which can drive the light-emitting layer to emit light at the portion. Therefore, in this case, the opening of the pixel defining layer defines the shape of the sub-pixel.

For example, the shapes of the various sub-pixels as described in the embodiment of the present disclosure are all approximate shapes; and when the light-emitting layer or various electrode layers are formed, it cannot be ensured that an edge of a sub-pixel is a strict straight line and a corner thereof is a strict angle. For example, the light-emitting layer may be formed by using an evaporation process with a mask, and thus, its corner portion may have a rounded shape. In some cases, a draft angle is needed in a metal etching process, so when a light-emitting layer of a sub-pixel is formed by using an evaporation process, a corner of the light-emitting layer may be removed.

For example, in some examples, as illustrated by FIG. 8 and FIG. 9, within a same minimum repeating region 100, a first color light-emitting layer 1111 of a first color sub-pixel block 111 of a third virtual rectangle 130 and a first color light-emitting layer 1111 of a first color sub-pixel block 111 of a fourth virtual rectangle 140 may be formed by sharing a same single color pattern region, for example, formed through a same opening of a mask.

For example, in some examples, an area of the first color light-emitting layer 1111 of the first color sub-pixel block 111 of the third virtual rectangle 130 and the first color light-emitting layer 1111 of the first color sub-pixel block 111 of the fourth virtual rectangle 140 formed by sharing a same single color pattern region is larger than a sum of an area of a first color pixel electrode 1110 of the first color sub-pixel block 111 of the third virtual rectangle 130 and an area of a first color pixel electrode 1110 of the first color sub-pixel block 111 of the fourth virtual rectangle 140.

For example, in some examples, because a distance between a center of the first color sub-pixel block 111 of the third virtual rectangle 130 and a center of the first color sub-pixel block 111 of the fourth virtual rectangle 140 is larger than ½ of a length of a second edge 1102, the area of the first color light-emitting layer 1111 of the first color sub-pixel block 111 of the third virtual rectangle 130 and the first color light-emitting layer 1111 of the first color sub-pixel block 111 of the fourth virtual rectangle 140 formed by sharing a same single color pattern region is larger than 1.5 times the sum of the area of the first color pixel electrode 1110 of the first color sub-pixel block 111 of the third virtual rectangle 130 and the area of the first color pixel electrode 1110 of the first color sub-pixel block 111 of the fourth virtual rectangle 140.

For example, in some examples, as illustrated by FIG. 8 and FIG. 9, within two minimum repeating regions 100 adjacent to each other in a second direction, the adjacent two minimum repeating regions 100 in the second direction include a first minimum repeating region 1001 and a second minimum repeating region 1002 sequentially arranged in the second direction; and a first color light-emitting layer 1111 of a first color sub-pixel block 111 of a first virtual rectangle 110 within the first minimum repeating region 1001 and a first color light-emitting layer 1111 of a first color sub-pixel block 111 of a second virtual rectangle 120 within the second minimum repeating region 1002 may be formed by sharing a same single color pattern region, for example, formed through a same opening of the mask.

For example, in some examples, an area of the first color light-emitting layer 1111 of the first color sub-pixel block 111 of the first virtual rectangle 110 within the first minimum repeating region 1001 and the first color light-emitting layer 1111 of the first color sub-pixel block 111 of the second virtual rectangle 120 within the second minimum repeating region 1002 formed by sharing a same single color pattern region is larger than a sum of an area of a first color pixel electrode 1110 of the first color sub-pixel block 111 of the first virtual rectangle 110 within the first minimum repeating region 1001 and an area of a first color pixel electrode 1110 of the first color sub-pixel block 111 of the second virtual rectangle 120 within the second minimum repeating region 1002.

For example, because a distance between a center of the first color sub-pixel block 111 of the first virtual rectangle 110 within the first minimum repeating region 1001 and a center of the first color sub-pixel block 111 of the second virtual rectangle 120 within the second minimum repeating region 1002 is larger than ½ of the length of the second edge 1102, the area of the first color light-emitting layer 1111 of the first color sub-pixel block 111 of the first virtual rectangle 110 within the first minimum repeating region 1001 and the first color light-emitting layer 1111 of the first color sub-pixel block 111 of the second virtual rectangle 120 within the second minimum repeating region 1002 formed by sharing a same single color pattern region is larger than 1.5 times the sum of the area of the first color pixel electrode 1110 of the first color sub-pixel block 111 of the first virtual rectangle 110 within the first minimum repeating region 1001 and the area of the first color pixel electrode 1110 of the first color sub-pixel block 111 of the second virtual rectangle 120 within the second minimum repeating region 1002.

For example, in some examples, a first color sub-pixel block 111, a second color sub-pixel block 112 and a third color sub-pixel block 113 may separately serve as one sub-pixel for display; and a first color sub-pixel block 111, a second color sub-pixel block 112 and a third color sub-pixel block 113 in each virtual rectangle may constitute a pixel unit for color display. Of course, the embodiment of the present disclosure includes, but is not limited thereto, and the first color sub-pixel block 111, the second color sub-pixel block 112 and the third color sub-pixel block 113 may be respectively combined with an adjacent same color sub-pixel block located in a different virtual rectangle into one sub-pixel, for example, at a shared edge of the adjacent virtual rectangle, for display. For example, a first edge 1101 passes through the combined sub-pixel, and the combined sub-pixel is symmetrical with respect to the first edge 1101. For example, in some examples, as illustrated by FIG. 8 and FIG. 9, within the same minimum repeating region 100, a second color pixel electrode 1120 of a second color sub-pixel block 112 of the first virtual rectangle 110 and a second color pixel electrode 1120 of a second color sub-pixel block 112 of the second virtual rectangle 120 are combined into a same pixel electrode, so as to serve as one pixel electrode for loading a data signal to display a same grayscale. For example, in some examples, as illustrated by FIG. 8 and FIG. 9, within two minimum repeating regions 100 adjacent to each other in the second direction, the adjacent two minimum repeating regions 100 in the second direction include a first minimum repeating region 1001 and a second minimum repeating region 1002 sequentially arranged in the second direction; and a second color pixel electrode 1120 of a second color sub-pixel block 112 of a fourth virtual rectangle 140 within the first minimum repeating region 1001 and a second color pixel electrode 1120 of a second color sub-pixel block 112 of a third virtual rectangle 130 within the second minimum repeating region 1002 are combined into a same pixel electrode, so as to serve as one pixel electrode for loading a data signal to display a same grayscale.

For example, in some examples, as illustrated by FIG. 8 and FIG. 9, within the same minimum repeating region 100, a third color pixel electrode 1130 of a third color sub-pixel block 113 of the first virtual rectangle 110 and a third color pixel electrode 1130 of a third color sub-pixel block 113 of the second virtual rectangle 120 are combined into a same pixel electrode, so as to serve as one pixel electrode for loading a data signal to display a same grayscale.

For example, in some examples, as illustrated by FIG. 8 and FIG. 9, within two minimum repeating regions 100 adjacent to each other in the second direction, the adjacent two minimum repeating regions 100 in the second direction include a first minimum repeating region 1001 and a second minimum repeating region 1002 sequentially arranged in the second direction; and a third color pixel electrode 1130 of a third color sub-pixel block 113 of the fourth virtual rectangle 140 within the first minimum repeating region 1001 and a third color pixel electrode 1130 of a third color sub-pixel block 113 of the third virtual rectangle 130 within the second minimum repeating region 1002 are combined into a same pixel electrode, so as to serve as one pixel electrode for loading a data signal to display a same grayscale.

Figure 10:
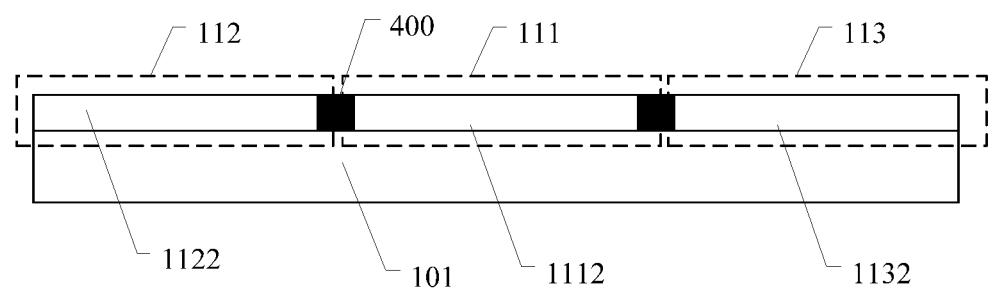
FIG. 10 is a cross-sectional schematic diagram of a display substrate taken along direction A-A' in FIG. 8 provided by an embodiment of the present disclosure.

FIG. 10 is a cross-sectional schematic diagram of another display substrate taken along direction A-A' in FIG. 8 provided by an embodiment of the present disclosure. As illustrated by FIG. 10, a first color sub-pixel block 111 includes a first color filter 1112, a second color sub-pixel block 112 includes a second color filter 1122, and a third color sub-pixel block 113 includes a third color filter 1132. Thus, the display substrate may be a color filter substrate. It should be noted that, when the display substrate is a color filter substrate, it is not only applicable to a liquid crystal display panel, but also applicable to a display panel in a mode combining a white light OLED with a color filter.

For example, in some examples, as illustrated by FIG. 10, the display substrate further comprises a black matrix 400 provided among the first color filter 1112, the second color filter 1122 and the third color filter 1132.

An embodiment of the present disclosure further provides a display device. The display device comprises any one of the display substrates provided by the above-described embodiments. Therefore, resolution of the display device may be improved, and a display device having true high resolution may be further provided. In addition, the pixel arrangement structure has better symmetry, so the display device has a better display effect.

For example, in some examples, the display device may be a smart phone, a tablet personal computer, a television, a monitor, a laptop, a digital photo frame, a navigator, and any other product or component having a display function.

An embodiment of the present disclosure further provides a mask plate set. The mask plate set is configured to form the pixel arrangement structure provided by any one of the above-described examples.

For example, the mask plate set may comprise a first mask plate for forming a first color sub-pixel block, a second mask plate for forming a second color sub-pixel block, and a third mask plate for forming a third color sub-pixel block; that is to say, the mask plate is a mask for evaporation.

For example, the first mask plate may be provided thereon with a first opening, to form a light-emitting layer of a first color sub-pixel block in an evaporation process; the second mask plate may be provided thereon with a second opening, to form a light-emitting layer of a second color sub-pixel block in an evaporation process; and the third mask plate may be provided thereon with a third opening, to form a light-emitting layer of a third color sub-pixel block in an evaporation process.

Figure 11A:
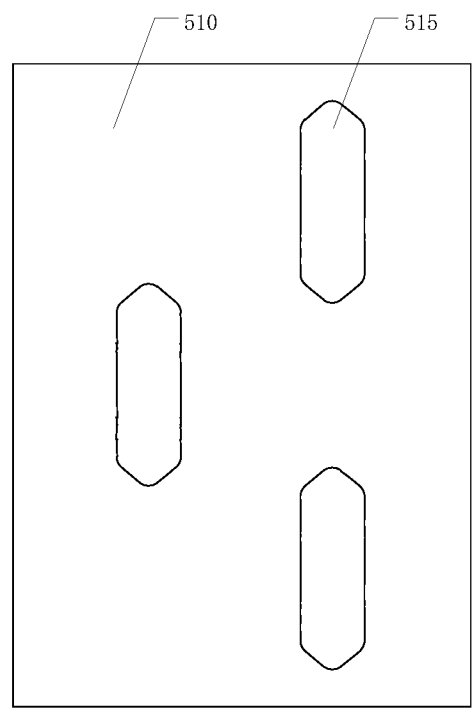
FIG. 11A is a schematic diagram of a first mask provided by an embodiment of the present disclosure.
Figure 11B:
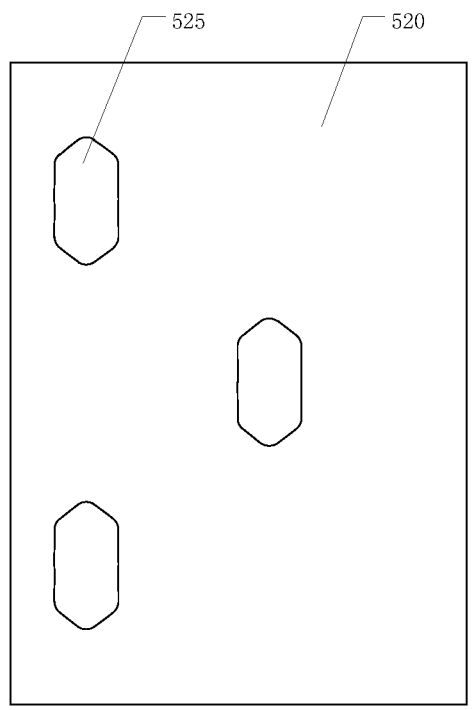
FIG. 11B is a schematic diagram of a second mask provided by the embodiment of the present disclosure.
Figure 11C:
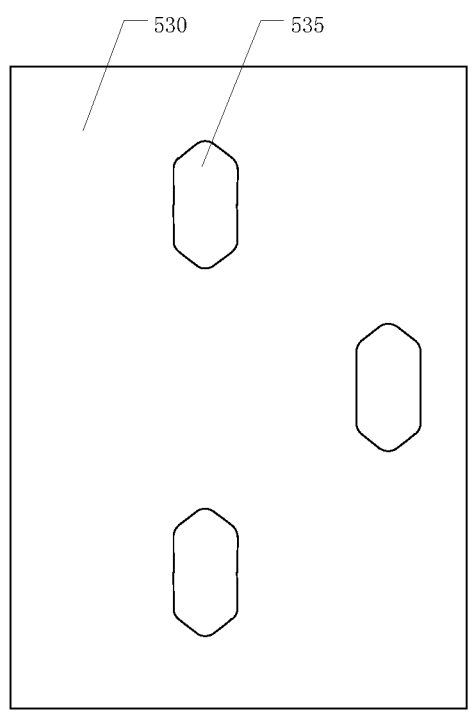
FIG. 11C is a schematic diagram of a third mask provided by the embodiment of the present disclosure.

FIG. 11A is a schematic diagram of the first mask plate provided by the embodiment of the present disclosure; FIG. 11B is a schematic diagram of the second mask plate provided by the embodiment of the present disclosure; and FIG. 11C is a schematic diagram of the third mask plate provided by the embodiment of the present disclosure. As illustrated by FIG. 11A to FIG. 11C, the mask plate set comprises: a first mask plate 510, including a first opening 515, and configured to form a first color sub-pixel block; a second mask plate 520, including a second opening 525, and configured to form a second color sub-pixel block; and a third mask plate 530, including a third opening 535, and configured to form a third color sub-pixel block; wherein a first color light-emitting layer of a first color sub-pixel block of a third virtual rectangle and a first color light-emitting layer of a first color sub-pixel block of a fourth virtual rectangle are configured to be formed through the same first opening 515, which, thus, can reduce a fabrication difficulty and simplify a process.

For example, in some examples, a second color sub-pixel block of a first virtual rectangle and a second color sub-pixel block of a second virtual rectangle may be formed through the same second opening 525; and a third color sub-pixel of the first virtual rectangle and a third color sub-pixel block of the second virtual rectangle may also be formed through the same third opening 535.

The following statements should be noted:

(1) The drawings accompanying the embodiment(s) of the present disclosure involve only the structure(s) in connection with the embodiment(s) of the present disclosure, and other structure(s) can be referred to common design(s).

(2) In case of no conflict, features in an embodiment or in different embodiments of the present disclosure can be combined with each other.

The above are merely specific implementations of the present disclosure without limiting the protection scope of the present disclosure thereto. Within the technical scope revealed in the present disclosure, modification(s) or substitution(s) may be easily conceivable for those skilled who are familiar with the present technical field, and these modification(s) and substitution(s) all should be contained in the protection scope of the present disclosure. Therefore, the protection scope of the present disclosure should be based on the protection scope of the appended claims.

What is claimed is:
1. A display substrate, comprising:
a base substrate;
a plurality of first color sub-pixel blocks, a plurality of
second color sub-pixel blocks and a plurality of third color sub-pixel blocks, arranged on the base substrate and distributed in a plurality of minimum repeating regions, wherein each of the plurality of minimum repeating regions has a shape of rectangle and comprises a first virtual rectangle; the first virtual rectangle comprises one first color sub-pixel block of the plurality of first color sub-pixel blocks, one second color sub-pixel block of the plurality of second color sub-pixel blocks and one third color sub-pixel block of the plurality of third color sub-pixel blocks, the first virtual rectangle comprises a first edge extending in a first direction and a second edge extending in a second direction; and the second color sub-pixel block and the third color sub-pixel block are distributed on two sides of a perpendicular bisector of the first edge; a distance between the second color sub-pixel block and the first edge and a distance between the third color sub-pixel block and the first edge are both smaller than a distance between the first color sub-pixel block and the first edge; and a center of the first color sub-pixel block is located on the perpendicular bisector of the first edge, each of the plurality of minimum repeating regions further comprises a second virtual rectangle, a third virtual rectangle and a fourth virtual rectangle; the first virtual rectangle, the second virtual rectangle, the third virtual rectangle and the fourth virtual rectangle form a 2*2 matrix in an edge-sharing manner to constitute one of the plurality of minimum repeating regions;

the second virtual rectangle shares the first edge with the first virtual rectangle, and the second virtual rectangle is mirror-symmetrical to the first virtual rectangle with respect to the first edge;

the first virtual rectangle coincides with the third virtual rectangle by shifting a distance of a length of a diagonal line of the first virtual rectangle along the diagonal line;

the third virtual rectangle comprises a third edge extending in the first direction; the fourth virtual rectangle shares the third edge with the third virtual rectangle, the fourth virtual rectangle is mirror-symmetrical to the third virtual rectangle with respect to the third edge; the third edge and the first edge are located in the same straight line;

the first color sub-pixel block comprises a first color pixel electrode and a first color light-emitting layer provided on the first color pixel electrode, the first color pixel electrode is configured to drive the first color light-emitting layer to emit light;

within the same one of the plurality of minimum repeating regions, an area of the first color light-emitting layer of the first color sub-pixel block of the third virtual rectangle and the first color light-emitting layer of the first color sub-pixel block of the fourth virtual rectangle is larger than a sum of an area of the first color pixel electrode of the first color sub-pixel block of the third virtual rectangle and an area of the first color pixel electrode of the first color sub-pixel block of the fourth virtual rectangle;

within two adjacent ones of the plurality of minimum repeating regions in the second direction, the two adjacent ones of the plurality of minimum repeating regions comprise a first minimum repeating region and a second minimum repeating region sequentially arranged in the second direction; an area of the first color light-emitting layer of the first color sub-pixel block of the first virtual rectangle of the first minimum repeating region and the first color light-emitting layer of the first color sub-pixel block of the second virtual rectangle of the second minimum repeating region is larger than a sum of an area of the first color pixel electrode of the first color sub-pixel block of the first virtual rectangle of the first minimum repeating region and an area of the first color pixel electrode of the first color sub-pixel block of the second virtual rectangle of the second minimum repeating region.

2. The display substrate according to claim 1, wherein the second color sub-pixel block and the third color sub-pixel block are respectively close to two ends of the first edge, and edges of the second color sub-pixel block and the third color sub-pixel block that are away from a center of the first virtual rectangle are located on the first edge.

3. The display substrate according to claim 1, wherein a shape of the first color sub-pixel block is a right-base-angle symmetrical pentagon;

the right-base-angle symmetrical pentagon is symmetrical with respect to the perpendicular bisector of the first edge; and a base of the right-base-angle symmetrical pentagon is further away from the first edge than a vertex of the right-base-angle symmetrical pentagon in a direction perpendicular to the first edge.

4. The display substrate according to claim 1, wherein shapes of the second color sub-pixel block and the third color sub-pixel block are both right-base-angle symmetrical pentagons; bases of the right-base-angle symmetrical pentagons are parallel to the first edge or are located on the first edge, and are closer to the first edge than the vertexes of the right-base-angle symmetrical pentagons in the direction perpendicular to the first edge.

5. The display substrate according to claim 1, wherein shapes of the second color sub-pixel block and the third color sub-pixel block are both right-base-angle pentagons; bases of the right-base-angle pentagons are parallel to the first edge or are located on the first edge, and are closer to the first edge than vertexes of the right-base-angle pentagons in a direction perpendicular to the first edge; each of the right-base-angle pentagons comprises a first oblique edge and a second oblique edge passing through the vertex of the each of the right-base-angle pentagons; the first oblique edge is opposite to the first color sub-pixel block located within the same virtual rectangle; and a length of the first oblique edge is larger than a length of the second oblique edge, a shape of the first color sub-pixel block is a right-base-angle symmetrical pentagon; the right-base-angle symmetrical pentagon is symmetrical with respect to the perpendicular bisector of the first edge; a base of the right-base-angle symmetrical pentagon is parallel to the first edge, and is further away from the first edge than a vertex of the right-base-angle symmetrical pentagon in the direction perpendicular to the first edge; the right-base-angle symmetrical pentagon comprises a third oblique edge and a fourth oblique edge passing through the vertex of the right-base-angle symmetrical pentagon; the third oblique edge and the fourth oblique edge are equal in length; the third oblique edge of the first color sub-pixel block and the first oblique edge of the second color sub-pixel block located within the same virtual rectangle are parallel to each other and have a spacing of a first distance; and the fourth oblique edge of the first color sub-pixel block and the first oblique edge of the third color sub-pixel block located within the same virtual rectangle are parallel to each other and have a spacing of a second distance, within the first virtual rectangle and the second virtual rectangle, the third color sub-pixel block is closer to a center of the minimum repeating region than the second color sub-pixel block; within the third virtual rectangle and the fourth virtual rectangle, the second color sub-pixel block is closer to the center of the minimum repeating region than the third color sub-pixel block;

the third color sub-pixel block in the first virtual rectangle is adjacent to the second color sub-pixel block in the fourth virtual rectangle; the third color sub-pixel block in the second virtual rectangle is adjacent to the second color sub-pixel block in the third virtual rectangle; the second oblique edge of the third color sub-pixel block in the first virtual rectangle and the second oblique edge of the second color sub-pixel block in the fourth virtual rectangle are parallel to each other and have a spacing of a third distance; and the second oblique edge of the third color sub-pixel block in the second virtual rectangle and the second oblique edge of the second color sub-pixel block in the third virtual rectangle are parallel to each other and have a spacing of a fourth distance.

6. The display substrate according to claim 5, wherein the first distance, the second distance, the third distance and the fourth distance are substantially equal to one another.

7. The display substrate according to claim 1, wherein shapes of the second color sub-pixel block and the third color sub-pixel block are both right-angled trapezoids; bases of the right-angled trapezoids are perpendicular to the first edge;

and a distance between a right-angle edge of the right-angled trapezoid and the first edge is less than a distance between an oblique edge of the right-angled trapezoid and the first edge, a shape of the first color sub-pixel block is a right-base-angle symmetrical pentagon; the right-base-angle symmetrical pentagon is symmetrical with respect to the perpendicular bisector of the first edge; a base of the right-base-angle symmetrical pentagon is parallel to the first edge, and is further away from the first edge than a vertex of the right-base-angle symmetrical pentagon in a direction perpendicular to the first edge; the right-base-angle symmetrical pentagon comprises a third oblique edge and a fourth oblique edge passing through the vertex of the right-base-angle symmetrical pentagon; the third oblique edge and the fourth oblique edge are equal in length; the third oblique edge of the first color sub-pixel block and the oblique edge of the second color sub-pixel block located within a same virtual rectangle are parallel to each other and have a spacing of a fifth distance; and the fourth oblique edge of the first color sub-pixel block and the oblique edge of the third color sub-pixel block located within the same virtual rectangle are parallel to each other and have a spacing of a sixth distance, within the first virtual rectangle and the second virtual rectangle, the third color sub-pixel block is closer to a center of the minimum repeating region than the second color sub-pixel block;

within the third virtual rectangle and the fourth virtual rectangle, the second color sub-pixel block is closer to the center of the minimum repeating region than the third color sub-pixel block; the third color sub-pixel block in the first virtual rectangle is adjacent to the second color sub-pixel block in the fourth virtual rectangle; the third color sub-pixel block in the second virtual rectangle is adjacent to the second color sub-pixel block in the third virtual rectangle;

an acute-angle portion of the third color sub-pixel block in the first virtual rectangle and an acute-angle portion of the second color sub-pixel block in the fourth virtual rectangle have a spacing of a seventh distance, and an acute-angle portion of the third color sub-pixel block in the second virtual rectangle and an acute-angle portion of the second color sub-pixel block in the third virtual rectangle have a spacing of an eighth distance.

8. The display substrate according to claim 7, wherein the fifth distance, the sixth distance, the seventh distance and the eighth distance are substantially equal to one another.

9. The display substrate according to claim 1, wherein, within the same one of the plurality of minimum repeating region, a second color sub-pixel block of the first virtual rectangle and a second color sub-pixel block of the second virtual rectangle are combined into a same sub-pixel;

within two adjacent ones of the plurality of minimum repeating regions in the second direction, the two adjacent ones of the plurality of minimum repeating regions comprise a first minimum repeating region and a second minimum repeating region sequentially arranged in the second direction; and the second color sub-pixel block of the fourth virtual rectangle of the first minimum repeating region and the second color sub-pixel block of the third virtual rectangle of the second minimum repeating region are combined into a same sub-pixel.

10. The display substrate according to claim 9, wherein, within the same one of the plurality of minimum repeating regions, the third color sub-pixel block of the first virtual rectangle and the third color sub-pixel block of the second virtual rectangle are combined into a same sub-pixel;

within two adjacent ones of the plurality of minimum repeating regions in the second direction, the two adjacent ones of the plurality of minimum repeating regions comprise a first minimum repeating region and a second minimum repeating region sequentially arranged in the second direction; and the third color sub-pixel block of the fourth virtual rectangle of the first minimum repeating region and the third color sub-pixel block of the third virtual rectangle of the second minimum repeating region are combined into a same sub-pixel.

11. The display substrate according to claim 1, wherein, within the same one of the plurality of minimum repeating regions, the first color sub-pixel block of the third virtual rectangle and the first color sub-pixel block of the fourth virtual rectangle share a same single color pattern region in a sub-pixel patterning process;

within two adjacent ones of the plurality of minimum repeating regions in the second direction, the two adjacent ones of the plurality of minimum repeating regions comprise a first minimum repeating region and a second minimum repeating region sequentially arranged in the second direction; and the first color sub-pixel block of the first virtual rectangle of the first minimum repeating region and the first color sub-pixel block of the second virtual rectangle of the second minimum repeating region share a same single color pattern region in a sub-pixel patterning process.

12. The display substrate according to claim 10, wherein at least one of the combined second color sub-pixel block and the combined third color sub-pixel block comprises a shape having a parallel edge group which is parallel to one of the first direction and the second direction, and two parallel edges in the parallel edge group have different lengths.

13. The display substrate according to claim 12, wherein the shape at least one of the combined second color sub-pixel block and the combined third color sub-pixel block is symmetrical with regard to a line in the other one of the first direction and the second direction.

14. The display substrate according to claim 1, wherein the second color sub-pixel block comprises a second color pixel electrode and a second color light-emitting layer provided on the second color pixel electrode, and the third color sub-pixel block comprises a third color pixel electrode and a third color light-emitting layer provided on the third color pixel electrode;
the second color pixel electrode is configured to drive the second color light-emitting layer to emit light; and
the third color pixel electrode is configured to drive the third color light-emitting layer to emit light.

15. The display substrate according to claim 14, wherein, within the same one of the plurality of minimum repeating regions, the first color light-emitting layer of the first color sub-pixel block of the third virtual rectangle and the first color light-emitting layer of the first color sub-pixel block of the fourth virtual rectangle are formed by sharing a same single color pattern. region;
within two adjacent ones of the plurality of minimum repeating regions in the second direction, the two adjacent ones of the plurality of minimum repeating regions comprise a first minimum repeating region and a second minimum repeating region sequentially arranged in the second direction; and the first color light-emitting layer of the first color sub-pixel block of the first virtual rectangle of the first minimum repeating region and the first color light-emitting layer of the first color sub-pixel block of the second virtual rectangle of the second minimum repeating region are formed by sharing a same single color pattern region.

16. The display substrate according to claim 14, wherein, within the same one of the plurality of minimum repeating regions, the second color pixel electrode of the second color sub-pixel block of the first virtual rectangle and the second color pixel electrode of the second color sub-pixel block of the second virtual rectangle are combined into a same pixel electrode;
within two adjacent ones of the plurality of minimum repeating regions, the two adjacent ones of the plurality of minimum repeating regions comprise a first minimum repeating region and a second minimum repeating region sequentially arranged in the second direction; and the second color pixel electrode of the second color sub-pixel block of the fourth virtual rectangle of the first minimum repeating region and the second color pixel electrode of the second color sub-pixel block of the third virtual rectangle of the second minimum repeating region are combined into a same pixel electrode,
within the same one of the plurality of minimum repeating regions, the third color pixel electrode of the third color sub-pixel block of the first virtual rectangle and the third color pixel electrode of the third color sub-pixel block of the second virtual rectangle are combined into a same pixel electrode;
within two adjacent ones of the plurality of minimum repeating region in the second direction, the two adjacent ones of the plurality of minimum repeating region comprise a first minimum repeating region and a second minimum repeating region sequentially arranged in the second direction; and the third color pixel electrode of the third color sub-pixel block of the fourth virtual rectangle of the first minimum repeating region and the third color pixel electrode of the third color sub-pixel block of the third virtual rectangle of the second minimum repeating region are combined into a same pixel electrode.

17. A mask plate set, configured to manufacture the display substrate according to claim 14, comprising:
a first mask plate, comprising a first opening, and configured to form the first color sub-pixel block;
a second mask plate, comprising a second opening, and configured to form the second color sub-pixel block; and
a third mask plate, comprising a third opening, and configured to form the third color sub-pixel block;
wherein a first color light-emitting layer of the first color sub-pixel block of the third virtual rectangle and a first color light-emitting layer of the first color sub-pixel block of the fourth virtual rectangle are configured to be formed through the same first opening.

18. The display substrate according to claim 1, wherein the first color sub-pixel block comprises a first color filter, the second color sub-pixel block comprises a second color filter, and the third color sub-pixel block comprises a third color filter.

19. e display device, comprising the display substrate according to claim 1.

* * * * *